(12) United States Patent
Chuang et al.

(10) Patent No.: US 12,322,715 B2
(45) Date of Patent: Jun. 3, 2025

(54) METHOD OF FORMING INTEGRATED CHIP STRUCTURE HAVING SLOTTED BOND PAD IN STACKED WAFER STRUCTURE

(71) Applicant: Taiwan Semiconductor Manufacturing Company, Ltd., Hsinchu (TW)

(72) Inventors: Harry-Hak-Lay Chuang, Zhubei (TW); Li-Feng Teng, Hsinchu (TW); Wei Cheng Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 17/750,706

(22) Filed: May 23, 2022

(65) Prior Publication Data
US 2023/0245987 A1 Aug. 3, 2023

Related U.S. Application Data

(60) Provisional application No. 63/304,114, filed on Jan. 28, 2022.

(51) Int. Cl.
*H01L 23/00* (2006.01)
*H01L 23/522* (2006.01)
*H01L 23/528* (2006.01)

(52) U.S. Cl.
CPC ............. *H01L 24/05* (2013.01); *H01L 24/03* (2013.01); *H01L 24/08* (2013.01); *H01L 24/80* (2013.01); *H01L 23/5226* (2013.01); *H01L 23/5283* (2013.01); *H01L 2224/03614* (2013.01); *H01L 2224/03622* (2013.01); *H01L 2224/03845* (2013.01); *H01L 2224/05007* (2013.01); *H01L 2224/05014* (2013.01); *H01L 2224/05016* (2013.01); *H01L 2224/05082* (2013.01); *H01L 2224/05547* (2013.01); *H01L 2224/05551* (2013.01); *H01L 2224/05554* (2013.01); *H01L 2224/05557* (2013.01); *H01L 2224/05647* (2013.01); *H01L 2224/08147* (2013.01);

(Continued)

(58) Field of Classification Search
CPC ......... H01L 24/03; H01L 24/04; H01L 24/05; H01L 24/06; H01L 24/08; H01L 24/80
See application file for complete search history.

(56) References Cited

U.S. PATENT DOCUMENTS 10,157,867 B1 12/2018 Chen et al.
2001/0013657 A1 8/2001 Anand
(Continued)

*Primary Examiner* — Michael Jung
(74) *Attorney, Agent, or Firm* — Eschweiler & Potashnik, LLC

(57) ABSTRACT

The present disclosure relates integrated chip structure. The integrated chip structure includes one or more interconnects disposed within a dielectric structure over a substrate. A bond pad having a top surface is arranged along a top surface of the dielectric structure. The top surface of the bond pad includes a plurality of discrete top surface segments that are laterally separated from one another by non-zero distances that extend between interior sidewalls of the bond pad, as viewed in a cross-sectional view. The dielectric structure is disposed directly between the interior sidewalls of the bond pad.

20 Claims, 30 Drawing Sheets

(52) U.S. Cl.
CPC ............... *H01L 2224/80895* (2013.01); *H01L 2224/80896* (2013.01)

(56) References Cited

U.S. PATENT DOCUMENTS

| | | | |
|---|---|---|---|
| 2003/0230809 A1* | 12/2003 | Nakajima | ............... H01L 24/03 |
| | | | 257/E23.145 |
| 2010/0096760 A1 | 4/2010 | Yu et al. | |
| 2014/0042633 A1* | 2/2014 | Hong | .................... H01L 23/481 |
| | | | 257/773 |
| 2020/0035643 A1* | 1/2020 | Hirata | ..................... H01L 27/00 |
| 2021/0066222 A1 | 3/2021 | Chen et al. | |
| 2021/0132305 A1 | 5/2021 | Noguchi et al. | |
| 2021/0327838 A1* | 10/2021 | Hou | ........................ H01L 24/03 |
| 2022/0302056 A1* | 9/2022 | Wang | ..................... H01L 24/80 |
| 2022/0352441 A1* | 11/2022 | Lutgen | ................... H01L 24/08 |
| 2023/0178504 A1* | 6/2023 | Huang | ................ H01L 23/5223 |
| | | | 257/532 |

\* cited by examiner

METHOD OF FORMING INTEGRATED CHIP STRUCTURE HAVING SLOTTED BOND PAD IN STACKED WAFER STRUCTURE

REFERENCE TO RELATED APPLICATION

This Application claims the benefit of U.S. Provisional Application No. 63/304,114, filed on Jan. 28, 2022, the contents of which are hereby incorporated by reference in their entirety.

BACKGROUND

A multi-dimensional integrated chip is an integrated circuit having multiple substrates and/or dies, which are vertically stacked onto and electrically interconnected to one another. By electrically interconnecting the stacked substrates and/or dies, the multi-dimensional integrated chip acts as a single device, which provides improved performance, reduced power consumption, and a reduced footprint over conventional integrated chips. Therefore, multi-dimensional integrated chips provide a path to continue to meet the performance/cost demands of next-generation integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
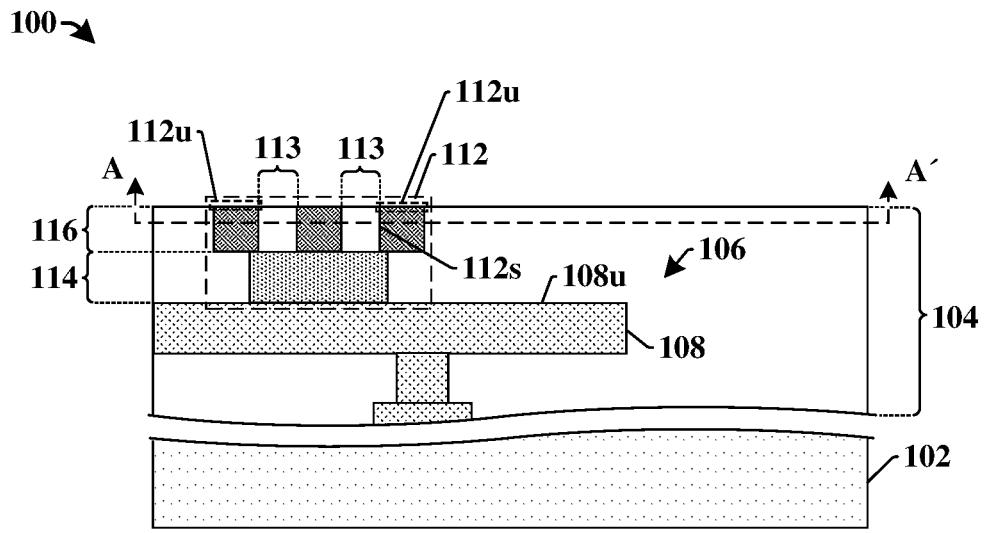
FIGS. 1A-1B illustrate some embodiments of an integrated chip structure comprising a bond pad having one or more cavities configured to reduce dishing of the bond pad.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-dimensional integrated chip structures (e.g., chip-on-wafer (CoW) structures, wafer-on-wafer (WoW) structures, three-dimensional integrated chip (3DIC) structures, or the like) are formed by stacking a plurality of integrated chip dies onto one another. The plurality of integrated chip dies are separately produced by forming interconnects within ILD layers overlying one or more semiconductor substrates. One or more bond pads are then formed over a top of the interconnects. The one or more bond pads may be formed by depositing a conductive material (e.g., a metal such as copper) within a bond pad opening, which extends through a dielectric material over the ILD layers, followed by a planarization process (e.g., a chemical mechanical planarization process). The bond pads of the integrated chip dies are then brought together to electrically couple the integrated chip dies.

When the planarization process is performed on the conductive material (e.g., copper) of the one or more bond pads, a polishing pad is brought into contact with both the conductive material and the surrounding dielectric material.

Because the conductive material is softer than the surrounding dielectric material, the polishing pad will remove the conductive material at a faster rate than the surrounding dielectric thereby causing the conductive material to recess or 'dish'. Such dishing causes the one or more bond pads to have a concave upper surface that drops below a top of the surrounding dielectric material. When the bond pads of two integrated chip die are subsequently brought together, a void (e.g., spaces) may form between the concave upper surfaces of the bond pads. The void can lead to a poor electrical connection between the integrated chip dies, which can decrease performance of and/or ultimately lead to failure of a multi-dimensional integrated chip structure.

The present disclosure relates to an integrated chip structure having a bond pad that is configured to mitigate dishing along a top of the bond pad. The disclosed integrated chip structure comprises a bond pad disposed within a dielectric structure over a substrate. The bond pad comprises interior sidewalls defining one or more cavities that are surrounded by the bond pad. The one or more cavities are filled with a dielectric material of the dielectric structure, so that a top surface of the bond pad comprises a plurality of discrete top surface segments that are laterally separated from one another by the dielectric structure, as viewed in a cross-sectional view. Because the dielectric material is disposed directly between the plurality of discrete top surface segments, a polishing pad used to form the bond pad will have a relatively small overlap with individual ones of the top surface segments. The relatively small overlap reduces dishing of the individual top surface segments. The reduced dishing decreases formation of voids when bond pads of separate integrated chip die are brought together, thereby improving an electrical performance and/or a reliability of a multi-dimensional integrated chip structure.

FIG. 1A illustrates a cross-sectional view of some embodiments of an integrated chip structure 100 comprising a bond pad having one or more cavities configured to reduce dishing of the bond pad.

The integrated chip structure 100 comprises one or more interconnects 106 disposed within a dielectric structure 104 over a substrate 102. A bond pad 112 is disposed within the dielectric structure 104 over the one or more interconnects 106. The bond pad 112 comprises a top surface disposed along a top surface of the dielectric structure 104. In some embodiments, the top surface of the bond pad 112 is substantially co-planar with the top surface of the dielectric structure 104. The plurality of interconnects 106 comprise a topmost interconnect 108 disposed within the dielectric structure 104. The topmost interconnect 108 comprises an upper surface 108u that directly contacts a bottommost surface of the bond pad 112. In some embodiments, the upper surface 108u may continuously extend past outermost sidewalls of the bottom surface of the bond pad 112.

In some embodiments, the bond pad 112 comprises a lower segment 114 and an upper segment 116 over the lower segment 114. The lower segment 114 laterally extends between opposing outermost edges of lower sidewalls of the bond pad 112. The lower sidewalls are arranged along a bottom of the bond pad 112. The upper segment 116 laterally extends between opposing outermost edges of upper sidewalls of the bond pad 112. The upper sidewalls are arranged along a top of the bond pad 112. In some embodiments, the upper segment 116 comprises a bottom surface that laterally extends from directly over the lower segment 114 to laterally past one or more of the lower sidewalls.

The bond pad 112 further comprises one or more interior sidewalls 112s that define one or more cavities 113 (e.g., one or more slots) within a top surface of the bond pad 112. The one or more cavities 113 separate the top surface of the bond pad 112 into a plurality of discrete top surface segments 112u, as viewed along the cross-sectional view of FIG. 1A. The dielectric structure 104 is disposed within the one or more cavities 113 and directly between the plurality of discrete top surface segments 112u. In some embodiments, the bottommost surface of the bond pad 112 laterally and continuously extends past one or more of the interior sidewalls 112s defining the one or more cavities 113.

Because the dielectric structure 104 is disposed directly between the plurality of discrete top surface segments 112u, an overlap between individual ones of the plurality of discrete top surface segments 112u and a chemical mechanical polishing (CMP) pad used to form the bond pad 112 is smaller than that of a bond pad not having one or more cavities. The smaller overlap reduces a dishing of the individual ones of the plurality of discrete top surface segments 112u. The reduced dishing mitigates formation of voids when the bond pad 112 is brought into contact with another bond pad, thereby improving an electrical performance and/or a reliability of a multi-dimensional integrated chip structure.

Figure 1B:
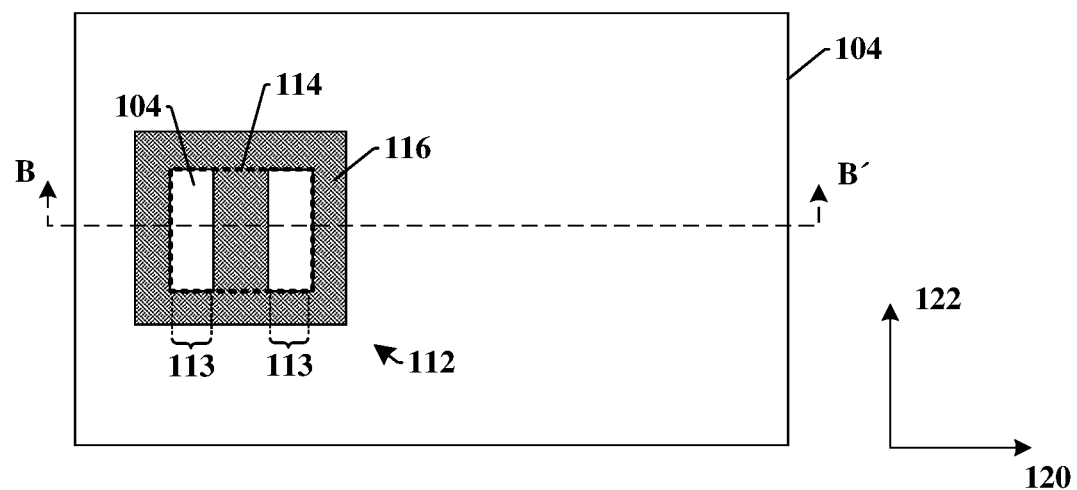

FIG. 1B illustrates a top-view 118 of some embodiments of the integrated chip structure 100 of FIG. 1A taken along cross-sectional line A-A'. In some embodiments, the cross-sectional view of FIG. 1A may be taken along cross-sectional line B-B' of the top-view 118.

As shown in the top-view 118, the bond pad 112 is surrounded by the dielectric structure 104. The upper segment 116 of the bond pad 112 extends around the one or more cavities 113 (e.g., one or more slots), which are filled with the dielectric structure 104. In some embodiments, the upper segment 116 continuously extends between outermost sidewalls of the bond pad 112 along a first direction 120 and/or along a second direction 122 that is perpendicular to the first direction 120. In some embodiments, the upper segment 116 continuously wraps around the one or more cavities 113 in a closed and unbroken loop. The upper segment 116 is directly over a part of the lower segment 114. In some embodiments, the one or more cavities 113 may also be directly over a part of the lower segment 114.

Figure 2:
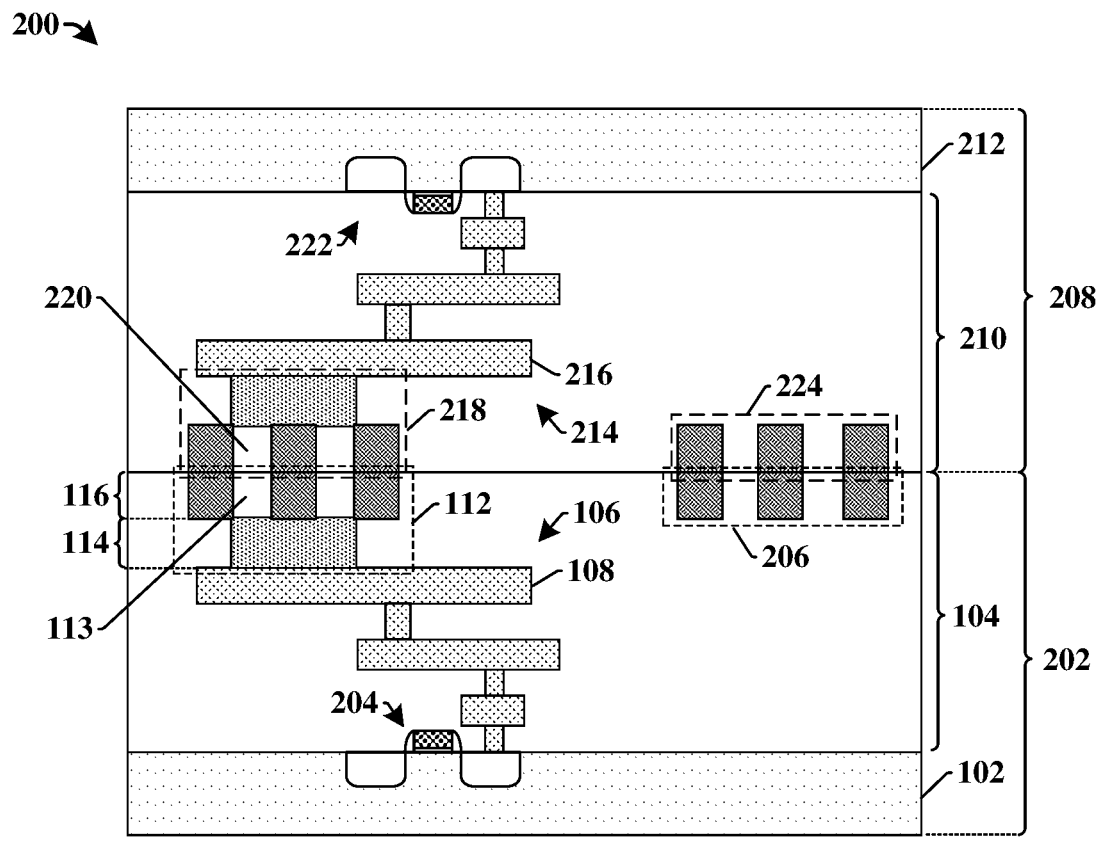
FIG. 2 illustrates a cross-sectional view of some embodiments of a multi-dimensional integrated chip structure comprising bond pads respectively having one or more cavities.

FIG. 2 illustrates a cross-sectional view of some embodiments of a multi-dimensional integrated chip structure 200 comprising bond pads having one or more cavities.

The multi-dimensional integrated chip structure 200 comprises a first integrated chip (IC) die 202 having a plurality of interconnects 106 arranged within a dielectric structure 104 on a substrate 102. In some embodiments, the plurality of interconnects 106 comprise a topmost interconnect 108 contacting a bond pad 112 arranged within the dielectric structure 104. In some embodiments, the plurality of interconnects 106 may electrically couple a bond pad 112 to one or more semiconductor devices 204 on and/or within the substrate 102. In various embodiments, the one or more semiconductor devices 204 may comprise a transistor device (e.g., a planar FET, a FinFET, a gate-all-around (GAA) device, etc.), an image sensor device (e.g., a photodiode), a MEMS (microelectromechanical system) device, and/or the like. The bond pad 112 has a top surface facing away from the substrate 102. The top surface of the bond pad 112 is disposed along a top surface of the dielectric structure 104 facing away from the substrate 102. The top surface comprises a plurality of discrete top surface segments that are separated by one or more cavities 113 filled with the dielectric structure 104, as viewed in the cross-sectional view.

The multi-dimensional integrated chip structure 200 further comprises a second IC die 208 having a plurality of additional interconnects 214 arranged within an additional dielectric structure 210 on an additional substrate 212. In some embodiments, the one or more additional interconnects 214 comprise an additional topmost interconnect 216 contacting an additional bond pad 218 arranged within the additional dielectric structure 210. In some embodiments, the plurality of additional interconnects 214 may electrically couple an additional bond pad 218 to one or more additional semiconductor devices 222 (e.g., a transistor device, an image sensor device, a MEMS device, and/or the like) on and/or within the additional substrate 212. The additional bond pad 218 has a surface facing away from the additional substrate 212. The surface of the additional bond pad 218 is disposed along a surface of the additional dielectric structure 210 facing away from the additional substrate 212. The surface of the additional bond pad 218 comprises a plurality of discrete segments that are separated by one or more additional cavities 220 filled with the additional dielectric structure 210, as viewed in the cross-sectional view.

In some embodiments, one or more dummy bond pads 206 may be arranged along the top surface of the dielectric structure 104 facing away from the substrate 102. The one or more dummy bond pads 206 may have a same layout as the bond pad 112. For example, the one or more dummy bond pads 206 may have a top surface that faces away from the substrate 102 and that comprises a plurality of discrete top surface segments that are separated by one or more cavities filled with the dielectric structure 104, as viewed in the cross-sectional view. In some embodiments, one or more additional dummy bond pads 224 may be arranged along the surface of the additional dielectric structure 210 facing away from the additional substrate 212. The one or more additional dummy bond pads 224 may have a same layout as the additional bond pad 218.

The first IC die 202 is bonded to the second IC die 208 along a hybrid bonding interface, in which the bond pad 112 contacts the additional bond pad 218 along a conductive interface and the dielectric structure 104 contacts the additional dielectric structure 210 along a dielectric interface. In some embodiments, the dielectric structure 104 within the one or more cavities 113 contacts the additional dielectric structure 210 within the one or more additional cavities 220 along the dielectric interface. In some embodiments, the plurality of discrete top surface segments of the bond pad 112 may laterally overlap the plurality of discrete segments of the surface of the additional bond pad 218. In some embodiments, at least one sidewall of the additional bond pad 218 may be directly over the top surface of the bond pad 112.

Because the dielectric structure 104 is disposed directly between the plurality of discrete top surface segments of the bond pad 112, the top surface of the bond pad 112 is substantially planar. Similarly, because the additional dielectric structure 210 is disposed directly between the plurality of discrete segments of the additional bond pad 218, the surface of the additional bond pad 218 is substantially planar. The substantially planar top surface of the bond pad 112 and the substantially planar surface of the additional bond pad 218 mitigate voids along an interface between the bond pad 112 and the additional bond pad 218, thereby improving an electrical performance and/or a reliability of the multi-dimensional integrated chip structure 200.

Figure 3A:
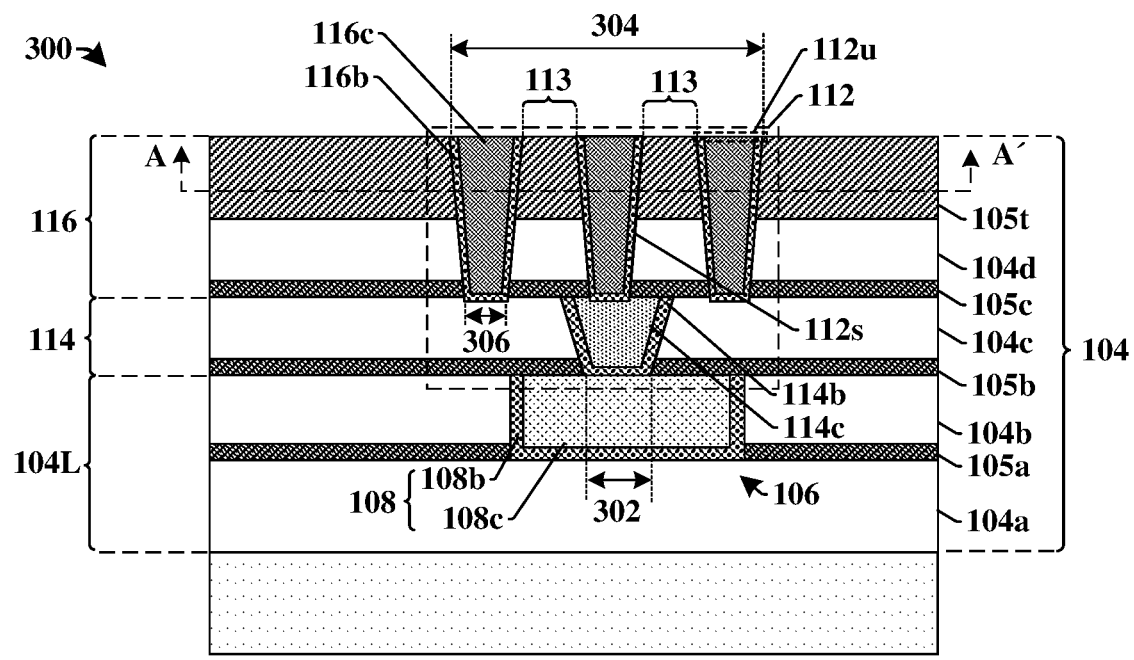
FIGS. 3A-3B illustrate some additional embodiments of an integrated chip structure comprising a bond pad having one or more cavities.

FIG. 3A illustrates a cross-sectional view of some additional embodiments of an integrated chip structure comprising a disclosed bond pad having one or more cavities.

The integrated chip structure 300 comprises a dielectric structure 104 over a substrate 102. In some embodiments, the dielectric structure 104 comprises a plurality of inter-level dielectric (ILD) layers 104a-104d stacked onto one another. The plurality of ILD layers 104a-104d may be vertically separated from one another by way of a plurality of etch stop layers 105a-105c. A top dielectric layer 105t is arranged along a top of the dielectric structure 104. In some embodiments, the plurality of ILD layers 104a-104d may comprise one or more of silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the plurality of etch stop layers 105a-105c and/or the top dielectric layer 105t may comprise a nitride (e.g., silicon nitride, silicon oxy-nitride, etc.), a carbide (e.g., silicon carbide, silicon oxy-carbide, etc.), or the like.

A plurality of interconnects 106 are disposed within a lower dielectric structure 104L of the dielectric structure 104. In some embodiments, the plurality of interconnects 106 comprise conductive contacts, interconnect wires, interconnect vias, and/or the like. The plurality of interconnects 106 comprise a topmost interconnect 108. In some embodiments, the topmost interconnect 108 may comprise a conductive core 108c surrounded by a barrier layer 108b. In some embodiments, the conductive core 108c may comprise copper, aluminum, or the like. In some embodiments, the barrier layer 108b may comprise titanium, titanium nitride, tantalum, tantalum nitride, or the like.

A bond pad 112 is disposed within the dielectric structure 104 and contacts the topmost interconnect 108. The bond pad 112 comprises a top surface arranged along a top surface of the dielectric structure 104. In some embodiments, the bond pad 112 comprises a lower segment 114 and an upper segment 116 over the lower segment 114. The lower segment 114 extends laterally between opposing outermost edges of lower sidewalls coupled to one or more bottom surfaces of the bond pad 112. In some embodiments, the lower segment 114 may have a first width 302 that is in a range of between approximately 0.2 μm (microns) and approximately 3 μm, between approximately 0.4 μm and approximately 2 μm, or other similar values. The upper segment 116 laterally extends between opposing outermost edges of upper outermost sidewalls of the bond pad 112. In some embodiments, the upper segment 116 may have a second width 304 that is greater than approximately 1.5 μm, greater than approximately 2 μm, or other similar values. Typically, a bond pad with a top surface having a relatively large size (e.g., greater than approximately 1.5 μm) will experience significant dishing that can lead to the formation of voids. However, by having one or more cavities 113 within the upper segment 116 of the bond pad 112 filled with the dielectric structure 104, the bond pad 112 is able to have a relatively large size (e.g., greater than approximately 1.5 μm) that provides for an electrical connection with another IC while avoiding significant dishing.

A lower surface of the upper segment 116 physically contacts an upper surface of the lower segment 114. In some embodiments, the lower segment 114 may comprise a first barrier layer 114b surrounding a first conductive core 114c. In some embodiments, the upper segment 116 may comprise a second barrier layer 116b surrounding a second conductive core 116c. In some embodiments, the second barrier layer 116b may be disposed directly between the second conductive core 116c and the first conductive core 114c. In some embodiments, the first conductive core 114c and the second conductive core 116c may comprise copper, aluminum, tungsten, or the like. In some embodiments, the first barrier layer 114b and the second barrier layer 116b may comprise titanium, titanium nitride, tantalum, tantalum nitride, or the like.

In some embodiments, the second barrier layer 116b of the upper segment 116 may extend a non-zero distance below a top of the first barrier layer 114b and/or the first conductive core 114c. In some embodiments, the first conductive core 114c may extend along sidewalls of the second barrier layer 116b. In some such embodiment, the upper outermost sidewalls of the bond pad 112 may extend vertically below a top of the lower sidewalls of the bond pad 112.

The top surface of the bond pad 112 comprises a plurality of discrete top surface segments 112u that are laterally separated from one another by one or more cavities 113 that are defined by interior sidewalls 112s of the bond pad 112. In some embodiments, the upper segment 116 may also comprise discrete lower surfaces that are separated from one another by the one or more cavities 113, as viewed in the cross-sectional view. In some embodiments, the discrete lower surfaces may respectively have a third width 306 that is in a range of between approximately 0.2 µm (microns) and approximately 3 µm, between approximately 0.4 µm and approximately 2 µm, or other similar values. The dielectric structure 104 is disposed directly between the interior sidewalls 112s of the bond pad 112.

Figure 3B:
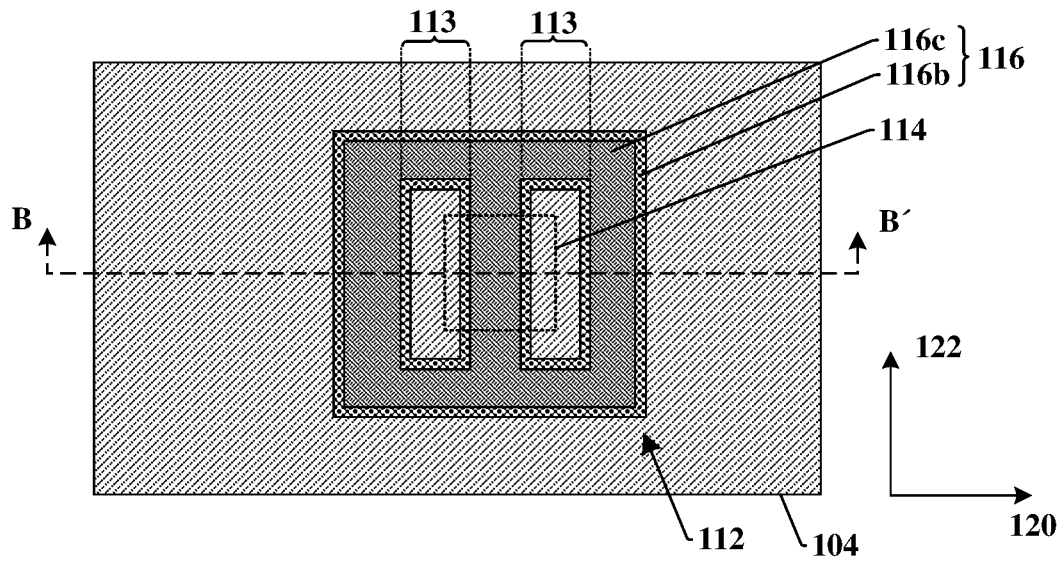

FIG. 3B illustrates a top-view 308 of some embodiments of the integrated chip structure 300 of FIG. 3A taken along cross-sectional line A-A'. In some embodiments, the cross-sectional view of FIG. 3A may be taken along cross-sectional line B-B' of the top-view 308.

As shown in the top-view 308, the bond pad 112 is surrounded by the dielectric structure 104. The upper segment 116 of the bond pad 112 extends around a boundary of the lower segment 114. In some embodiments, the one or more cavities 113 extend through the upper segment 116 and directly overlie a part of the lower segment 114. In some embodiments, the one or more cavities 113 may be rectangular shaped cavities that are surrounded by a continuous ring of the upper segment 116. In some embodiments, the continuous ring of the upper segment 116 extends along an outer perimeter of the upper segment 116.

Figure 4A:
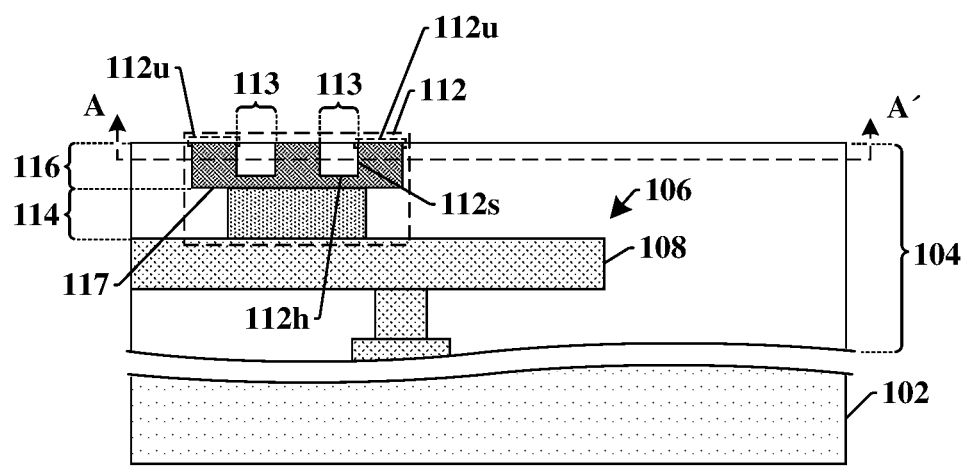
FIGS. 4A-4B illustrate some additional embodiments of an integrated chip structure comprising a bond pad having one or more cavities.

FIG. 4A illustrates a cross-sectional view of some additional embodiments of an integrated chip structure 400 comprising a disclosed bond pad having one or more cavities.

The integrated chip structure 400 comprises a bond pad 112 disposed within a dielectric structure 104 over a substrate 102. The bond pad 112 comprises a lower segment 114 and an upper segment 116 over the lower segment 114. The lower segment 114 extends laterally between opposing outermost sidewalls that are coupled to a bottom of the bond pad 112. The upper segment 116 extends laterally between opposing outermost sidewalls that are coupled to a top of the bond pad 112. In some embodiments, the upper segment 116 comprises interior sidewalls 112s that are coupled to horizontally extending surfaces 112h facing away from the substrate 102 to form one or more cavities 113 within a top surface of the bond pad 112. The horizontally extending surfaces 112h are directly above a bottom surface 117 of the upper segment 116.

In some embodiments, the one or more cavities 113 have a depth that is less than a height of the upper segment 116, so that the upper segment 116 extends along a bottom of the one or more cavities 113. In some embodiments, the bottom surface 117 of the upper segment 116 laterally and continuously extends past opposing outermost sidewalls of the lower segment 114 and past the one or more cavities 113. In some embodiments, the bottom surface 117 completely covers a top surface of the lower segment 114.

Figure 4B:
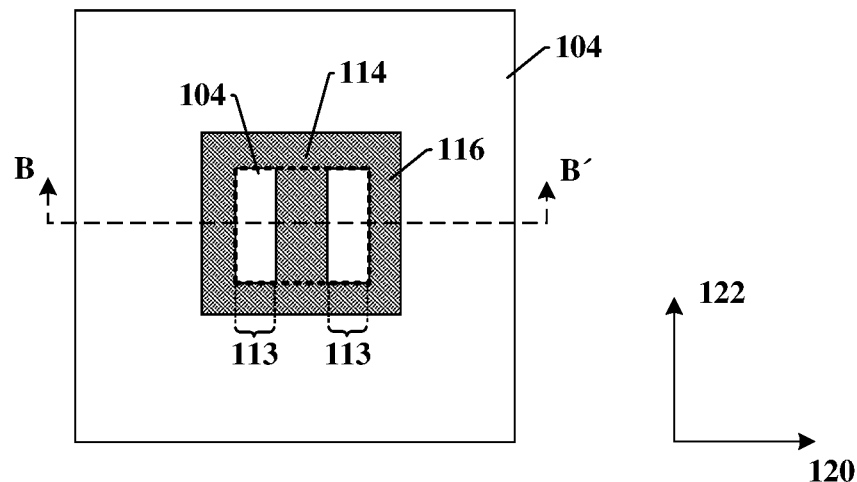

FIG. 4B illustrates a top-view 402 of some embodiments of the integrated chip structure 400 of FIG. 4A taken along cross-sectional line A-A'. In some embodiments, the cross-sectional view of FIG. 4A may be taken along cross-sectional line B-B' of the top-view 402.

As shown in the top-view 402, the bond pad 112 is surrounded by the dielectric structure 104. The upper segment 116 of the bond pad 112 extends around a boundary of the lower segment 114. In some embodiments, the one or more cavities 113 extend through the upper segment 116 and directly overlie the lower segment 114.

Figure 5:
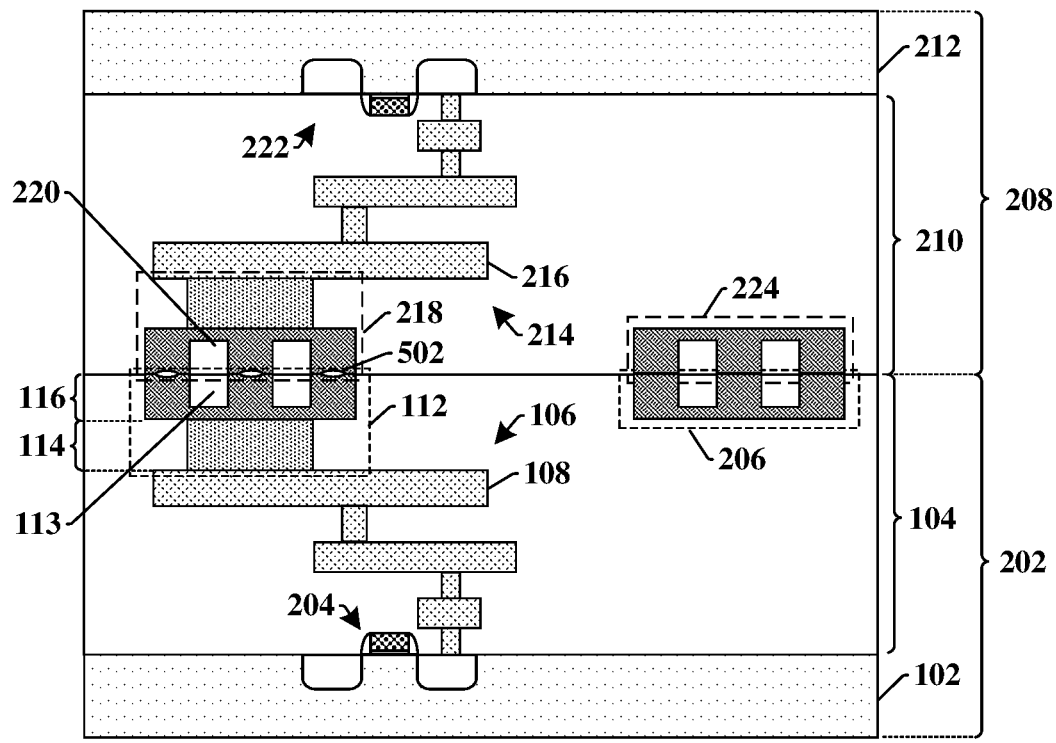
FIG. 5 illustrates a cross-sectional view of some embodiments of a multi-dimensional integrated chip structure comprising bond pads respectively having one or more cavities.

FIG. 5 illustrates a cross-sectional view of some additional embodiments of a multi-dimensional integrated chip structure 500 comprising disclosed bond pads respectively having one or more cavities.

The multi-dimensional integrated chip structure 500 comprises a first IC die 202 having a bond pad 112 arranged within a dielectric structure 104 over a substrate 102. The bond pad 112 has a top surface facing away from the substrate 102. The top surface comprises a plurality of discrete top surface segments that are separated by one or more cavities 113 that are defined by sidewalls and a horizontally extending surface of the bond pad 112. The one or more cavities 113 are filled with the dielectric structure 104.

The multi-dimensional integrated chip structure 500 further comprises a second IC die 208 having an additional bond pad 218 arranged within an additional dielectric structure 210 on an additional substrate 212. The additional bond pad 218 has a surface facing away from the additional substrate 212. The surface comprises a plurality of discrete segments that are separated by one or more additional cavities 220 that are defined by sidewalls and a horizontally extending surface of the additional bond pad 218. The one or more additional cavities 220 are filled with the additional dielectric structure 210.

In some embodiments, one or more dummy bond pads 206 may be arranged along a top surface of the dielectric structure 104 facing away from the substrate 102. The one or more dummy bond pad 206 may have a same layout as the bond pad 112. In some embodiments, one or more additional dummy bond pads 224 may be arranged along a surface of the additional dielectric structure 210 facing away from the additional substrate 212. The one or more additional dummy bond pad 224 may have a same layout as the additional bond pad 218.

The first IC die 202 is bonded to the second IC die 208 along a hybrid bonding interface, in which the bond pad 112 contacts the additional bond pad 218 along a conductive interface and the dielectric structure 104 contacts the additional dielectric structure 210 along a dielectric interface (e.g., the dielectric structure 104 within the one or more cavities 113 contacts the additional dielectric structure 210 within the one or more additional cavities 220 along the dielectric interface). In some embodiments, the plurality of discrete top surface segments of the bond pad 112 and/or the plurality of discrete segments of the additional bond pad 218 may have slight dishing, which causes small voids 502 to form along the conductive interface. However, because the one or more cavities mitigate CMP dishing, the small voids 502 have a minimal impact on a performance of the multi-dimensional integrated chip structure 500. In some embodiments, the small voids 502 may laterally extend along a part, but not all, of the conductive interface (e.g., the small voids 502 may be set back from opposing sides of the plurality of discrete top surface segments of the bond pad 112 by non-zero distances).

Although the disclosed multi-dimensional integrated chip structures (e.g., multi-dimensional integrated chip structure 200 and/or 500) are illustrated as three-dimensional integrated chip (3DIC) structures, it will be appreciated that the disclosed bond pad is not limited to such structures but rather may be integrated within various multi-dimensional integrated chip architectures. For example, in alternative embodiments the disclosed bond pad may be integrated within chip-on-wafer (CoW) structures, wafer-on-wafer (WoW) structures, or the like.

Figure 6A:
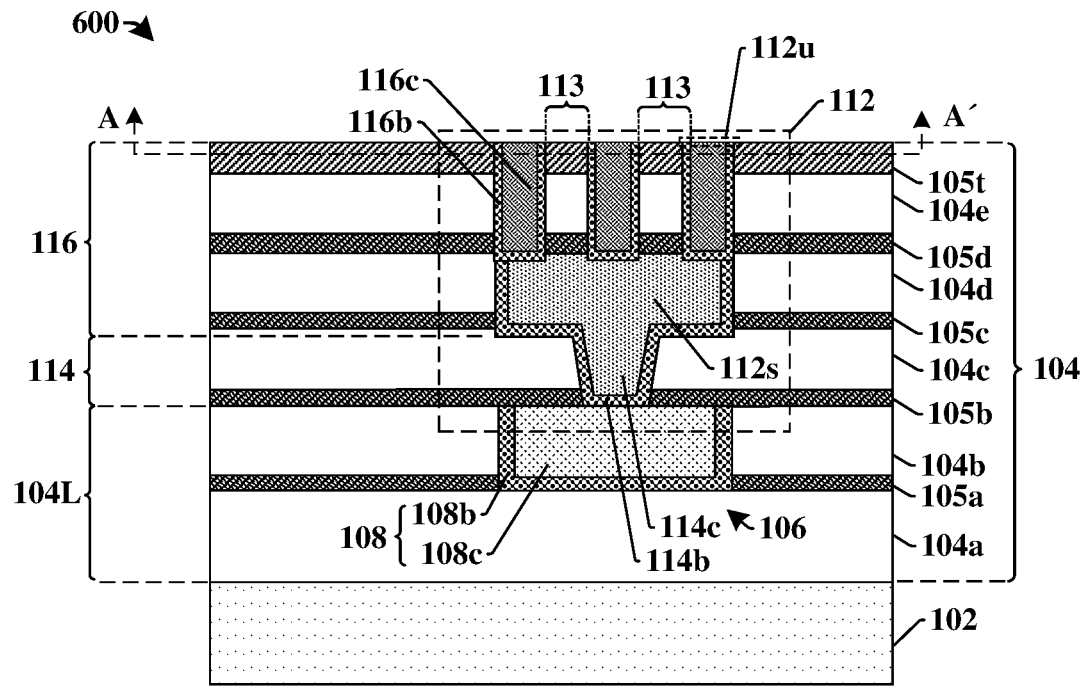
FIGS. 6A-6B illustrate some additional embodiments of an integrated chip structure comprising a bond pad having one or more cavities.

FIG. 6A illustrates a cross-sectional view of some additional embodiments of an integrated chip structure 600 comprising a disclosed bond pad having one or more cavities.

The integrated chip structure 600 comprises one or more interconnects 106 disposed within a dielectric structure 104 over a substrate 102. In some embodiments, the dielectric structure 104 comprises a plurality of inter-level dielectric (ILD) layers 104a-104e stacked onto one another. The plurality of ILD layers 104a-104e may be vertically separated from one another by way of a plurality of etch stop layers 105a-105d. A top dielectric layer 105t is arranged along a top of the dielectric structure 104.

A bond pad 112 is disposed within the dielectric structure 104. The bond pad 112 contacts a topmost interconnect 108 of the plurality of interconnects 106. The bond pad 112 comprises a lower segment 114 and an upper segment 116 over the lower segment 114. The lower segment 114 extends laterally between opposing outer sidewalls coupled to a bottom of the bond pad 112. The upper segment 116 laterally extends between opposing outermost sidewalls of the bond pad 112. In some embodiments, the lower segment 114 may comprise a first barrier layer 114b surrounding a first conductive core 114c. In some embodiments, the upper segment 116 may comprise a part of the first barrier layer 114b surrounding a part of the first conductive core 114c and a second barrier layer 116b surrounding a second conductive core 116c. In some embodiments, the second barrier layer 116b may be disposed directly between the second conductive core 116c and the first conductive core 114c. In some embodiments, the second barrier layer 116b may contact the first conductive core 114c at a location that is above a bottom of the upper segment 116 (e.g., that is above a bottom of the opposing outermost sidewalls of the bond pad 112). In some embodiments, the second barrier layer 116b may extend a non-zero distance below a top of the first barrier layer 114b and/or the first conductive core 114c.

In some embodiment, one or more cavities 113 extend into the upper segment 116 of the bond pad 112. The one or more cavities may by defined by sidewalls of the second barrier layer 116b and by an upper surface of the first conductive core 114c. The one or more cavities have a height that is less than a height of the upper segment 116 (e.g., less than heights of the opposing outermost sidewalls of the bond pad 112).

Figure 6B:
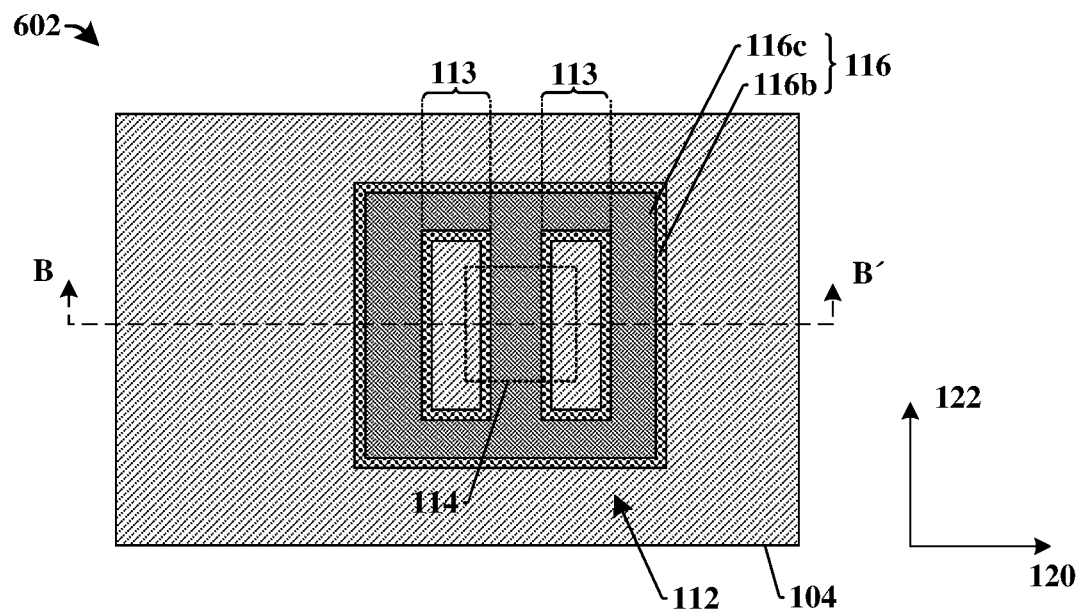

FIG. 6B illustrates a top-view 602 of some embodiments of the integrated chip structure 600 of FIG. 6A taken along cross-sectional line A-A'. In some embodiments, the cross-sectional view of FIG. 6A may be taken along cross-sectional line B-B' of the top-view 602.

As shown in the top-view 602, the upper segment 116 of the bond pad 112 is surrounded by the dielectric structure 104 and extends around a boundary of the lower segment 114. In some embodiments, the one or more cavities 113 extend through the upper segment 116 and directly overlie a part of the lower segment 114. In some embodiments, the one or more cavities 113 may be rectangular shaped regions that are surrounded by a continuous ring of the upper segment 116. In some embodiments, the one or more cavities 113 may directly overlie a part of the lower segment 114.

Figure 7A:
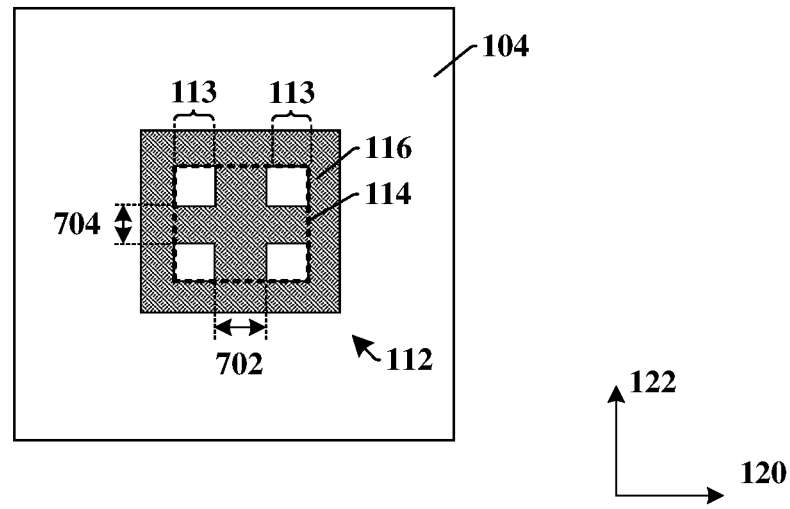
FIGS. 7A-7C illustrate top-views of some additional embodiments of an integrated chip structure comprising a disclosed bond pad having one or more cavities with different shapes and/or spatial configurations.
Figure 7B:
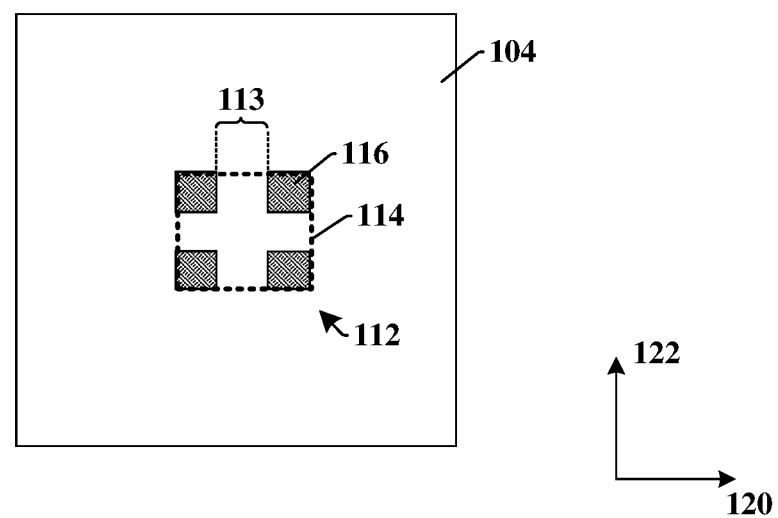
Figure 7C:
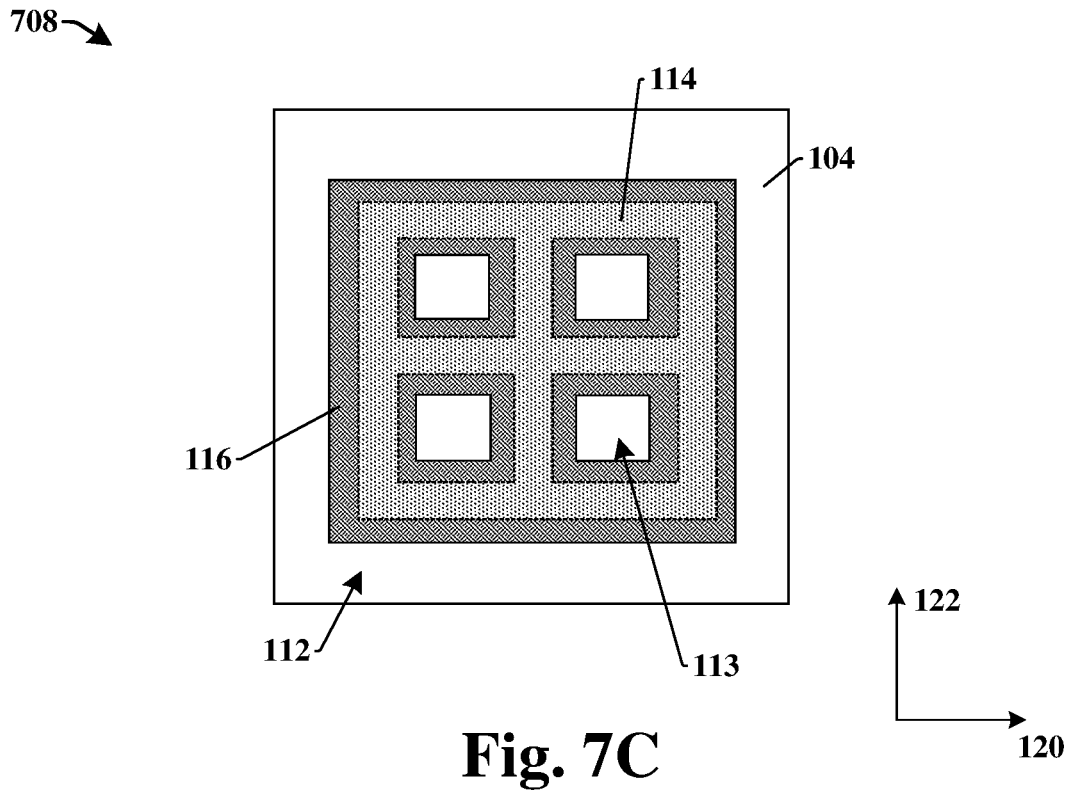

It will be appreciated that in various embodiments, an upper segment of the disclosed bond pad may have interior sidewalls defining one or more cavities having different shapes and/or spatial configurations. FIGS. 7A-7C illustrate top-views of various embodiments of an integrated chip structure comprising a disclosed bond pad having one or more cavities with different shapes and/or spatial configurations.

FIG. 7A illustrates a top-view 700 of some embodiments of an integrated chip structure comprising a bond pad 112 having one or more cavities 113 respectively having a square shape. The square shaped cavities extend to a first distance 702 along a first direction 120 and to a second distance 704 along a second direction 122 that is perpendicular to the first direction 120. The first distance 702 is approximately equal to the second distance 704. The square shaped cavities are surrounded by a continuous outer ring of an upper segment 116 of the bond pad 112 that wraps around the square shaped cavities. In some embodiments, the upper segment 116 of the bond pad 112 comprises a cross-shaped region that is coupled to the outer ring of the upper segment 116. The cross-shaped region separates the one or more cavities 113 from one another along the first direction 120 and along the second direction 122. The square shaped cavities and the cross-shaped region are directly over a lower segment 114 of the bond pad 112. The outer ring of the upper segment 116 is laterally outside of the lower segment 114 of the bond pad 112.

FIG. 7B illustrates a top-view 706 of some embodiments of an integrated chip structure comprising a bond pad 112 having one or more cavities 113 respectively having a cross-shape. The cross-shaped cavity is surrounded by discrete parts of an upper segment 116 of the bond pad 112. The discrete parts of the upper segment 116 of the bond pad 112 are directly over a lower segment 114 of the bond pad 112. The cross-shaped cavity has branches that completely separate the discrete parts of the upper segment 116 from one another along a first direction 120 and along a second direction 122 that is perpendicular to the first direction 120.

FIG. 7C illustrates a top-view 708 of some embodiments of an integrated chip structure comprising a bond pad 112 having one or more cavities 113 respectively having a square shape. The square shaped cavities are surrounded by a continuous outer ring of an upper segment 116 of the bond pad 112 that wraps around the square shaped cavities. The square shaped cavities directly overlie square shaped cavities extending through a lower segment 114 of the bond pad 112. In some embodiments, the lower segment of the bond pad 112 has a same pattern as the upper segment 116 of the bond pad 112.

Figure 8A:
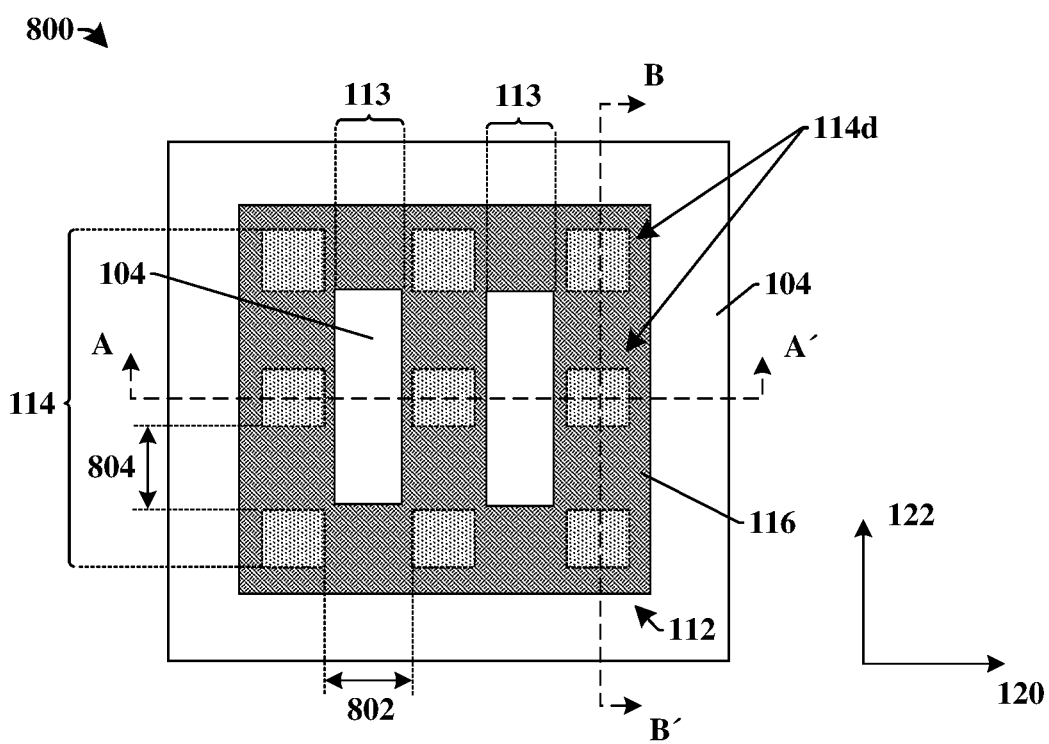
FIGS. 8A-8C illustrate some additional embodiments of an integrated chip structure comprising a bond pad having one or more cavities.

FIG. 8A illustrates a top-view of some additional embodiments of an integrated chip structure 800 comprising a disclosed bond pad having one or more cavities.

The integrated chip structure 800 comprises a bond pad 112 arranged within a dielectric structure 104. The bond pad comprises a lower segment 114 and an upper segment 116 over the lower segment 114. The upper segment 116 comprises interior sidewalls that define one or more cavities 113 surrounded by a continuous ring of the bond pad 112. The one or more cavities 113 are filled with the dielectric structure 104.

The lower segment 114 may comprise a plurality of discrete lower segments 114d that are arranged in an array. The plurality of discrete lower segments 114d may be separated by a first distance 802 along a first direction 120 and by a second distance 804 along a second direction 122 that is perpendicular to the first direction 120. In some embodiments, the plurality of discrete lower segments 114d may comprise square shaped segments. In other embodiments (not shown), the plurality of discrete lower segments 114d may comprise other shapes (e.g., circular shaped segments, octagonal shaped segments, polygonal shaped segments, or the like). In some embodiments, the plurality of discrete lower segments 114d are completely covered by the upper segment 116.

Figure 8B:
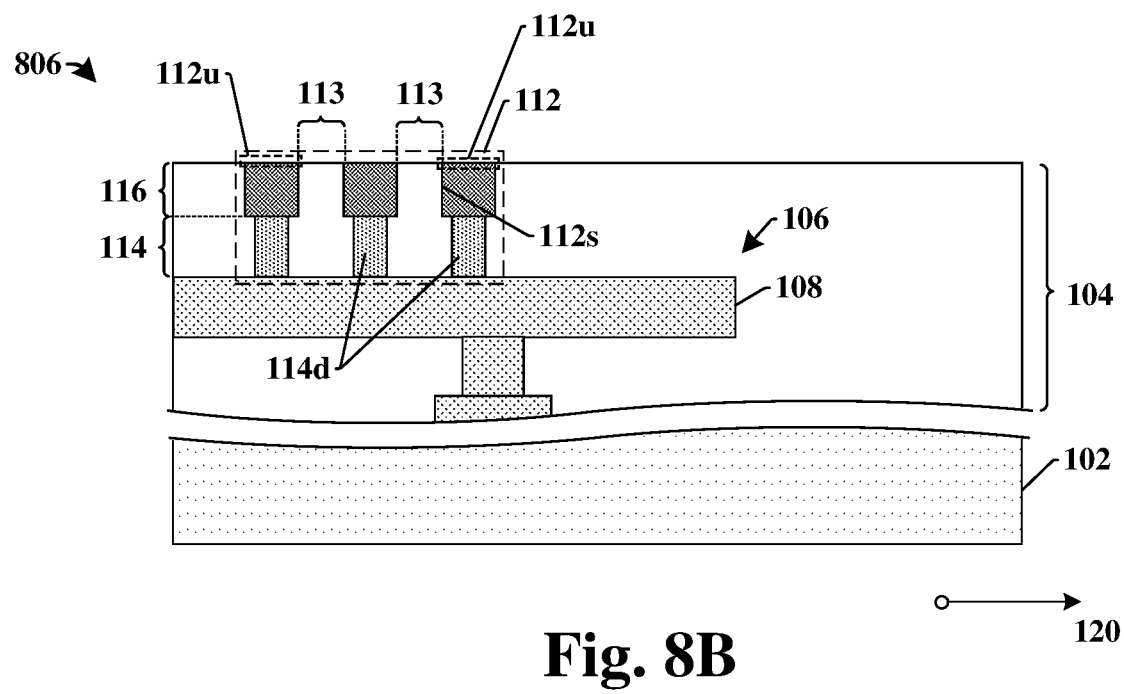

FIG. 8B illustrates a cross-sectional view 806 of some additional embodiments of the integrated chip structure of FIG. 8A taken along line A-A'.

As shown in cross-sectional view 806, the one or more cavities 113 extend completely through the bond pad 112, so that a part of the dielectric structure 104 that is between one or more sidewalls of the bond pad 112 continuously extends from a top of the bond pad 112 to a bottom of the bond pad 112. In some embodiments, the part of the dielectric structure 104 that is between one or more sidewalls of the bond pad 112 continuously extends from the top of the bond pad 112 to a topmost interconnect 108 within the dielectric structure 104.

The lower segment 114 of the bond pad 112 laterally extends in the first direction 120 between opposing outer edges of lower sidewalls of the bond pad 112. The lower sidewalls are arranged along a bottom of the bond pad 112. In some embodiments, the plurality of discrete lower segments 114d comprise a plurality of discrete lower surfaces contacting the topmost interconnect 108 and a plurality of discrete upper surfaces contacting the upper segment 116. Both the plurality of discrete lower surfaces and the plurality of discrete upper surfaces of the plurality of discrete lower segments 114d are laterally separated from one another by the dielectric structure 104 in the first direction 120.

The upper segment 116 of the bond pad 112 laterally extends between outermost sidewalls of the bond pad 112. The outermost sidewalls are arranged along a top of the bond pad 112. In some embodiments, the upper segment 116 may comprise a plurality of discrete lower surfaces laterally separated from one another by the dielectric structure 104. In some embodiments, the plurality of discrete lower surfaces of the upper segment 116 may respectively have a greater width than respective ones of the plurality of discrete upper surfaces of the plurality of discrete lower segments 114d. In some embodiments, the plurality of discrete lower surfaces of the upper segment 116 may respectively extend past one or more outer edges of the plurality of discrete upper surfaces of the plurality of discrete lower segments 114d.

Figure 8C:
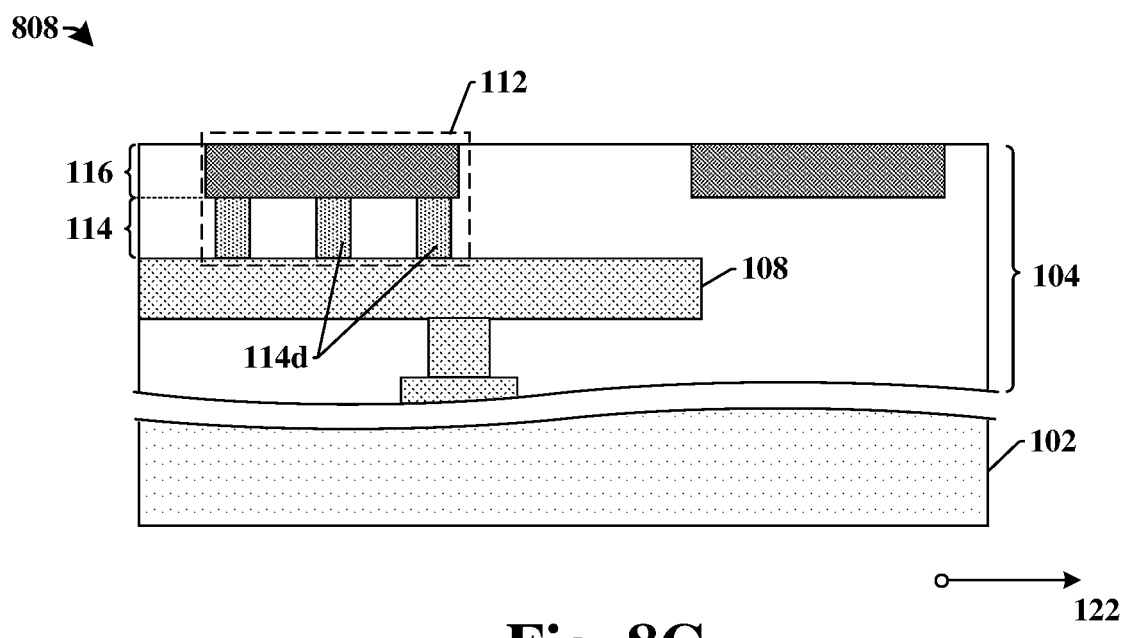

FIG. 8C illustrates a cross-sectional view 808 of some additional embodiments of the integrated chip structure of FIG. 8A taken along line B-B'.

As shown in cross-sectional view 808, the plurality of discrete lower segments 114d within the lower segment 114 are separated from one another along the second direction 122. The upper segment 116 has a lower surface that continuously extends in the second direction 122 over the plurality of discrete lower segments 114d.

Figure 9A:
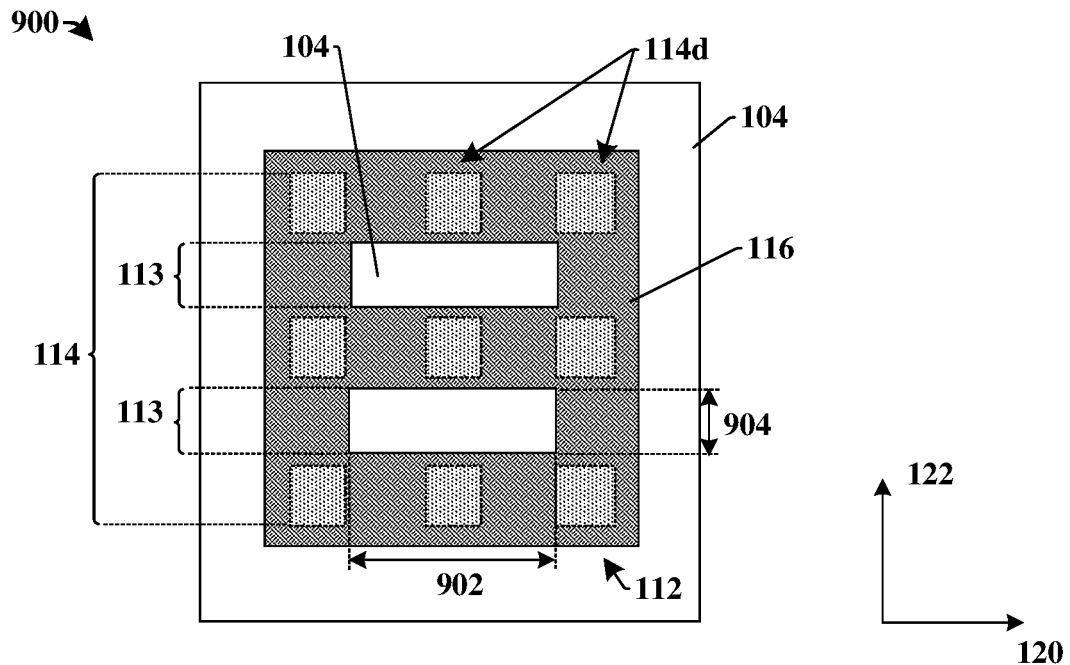
FIGS. 9A-9C illustrate top-views of some additional embodiments of an integrated chip structure comprising a disclosed bond pad having one or more cavities with different shapes and/or spatial configurations.
Figure 9B:
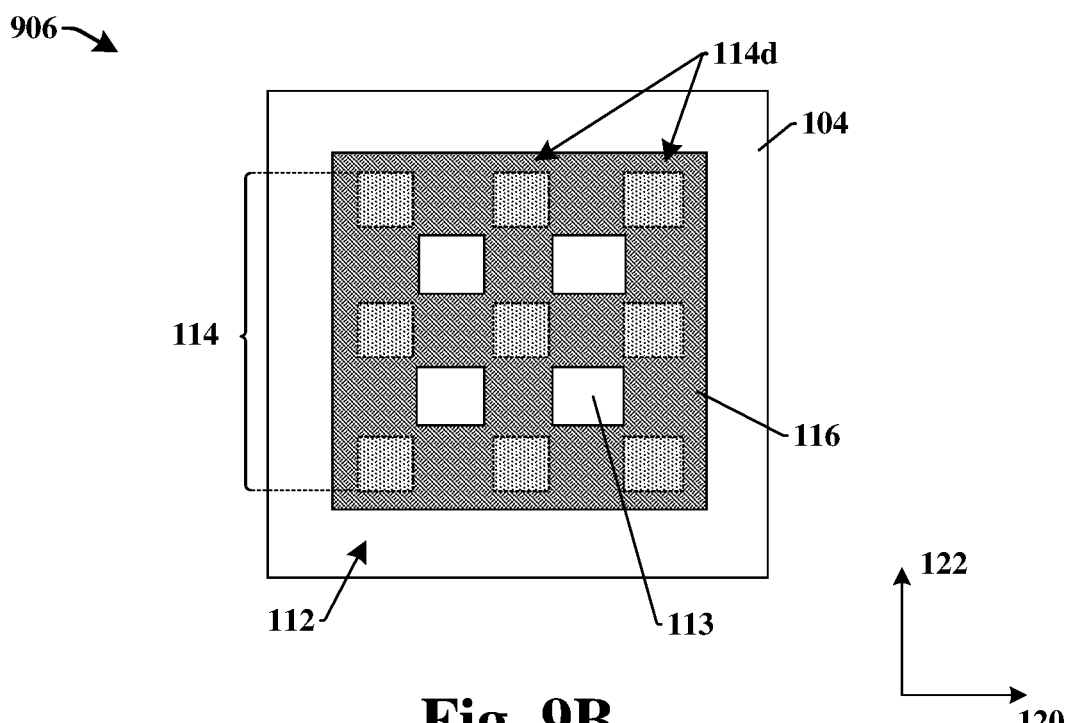
Figure 9C:
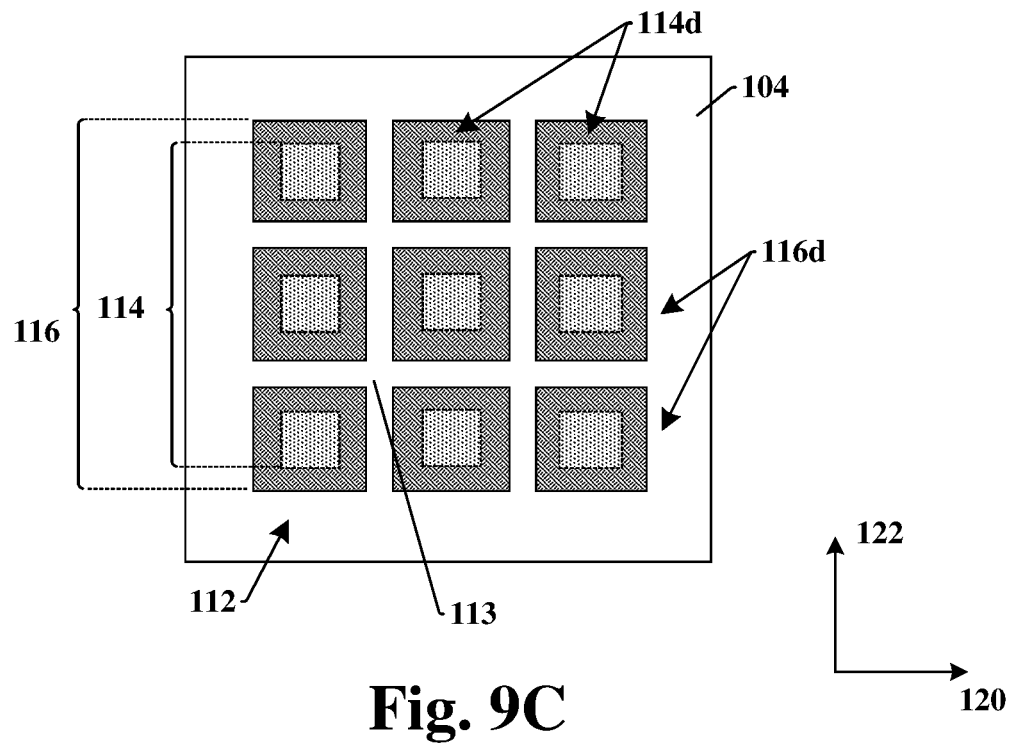

It will be appreciated that in various embodiments, a lower segment of the disclosed bond pad may have a plurality of discrete lower segments with different shapes and/or spatial configurations. FIGS. 9A-9C illustrate top-views of some additional embodiments of an integrated chip structure comprising a disclosed bond pad having one or more cavities.

FIG. 9A illustrates a top-view 900 of an integrated chip structure comprising a bond pad 112 having a lower segment 114 and an upper segment 116. The lower segment 114 comprises a plurality of discrete lower segments 114d that are arranged in an array extending in a first direction 120 and a second direction 122. The upper segment 116 directly overlies plurality of discrete lower segments 114d within the array. The upper segment 116 comprises sidewalls defining one or more cavities 113 having rectangular shapes. The rectangular shaped cavities extend to a first distance 902 along a first direction 120 and to a second distance 904 along a second direction 122. The second distance 904 is smaller than the first distance 902. The rectangular shaped cavities are surrounded by a continuous outer ring of the upper segment 116. A cross-bar extends between parts of the continuous outer ring of the upper segment 116 to separate the rectangular shaped cavities.

FIG. 9B illustrates a top-view 906 of an integrated chip structure comprising a bond pad 112 having a lower segment 114 and an upper segment 116. The lower segment 114 comprises a plurality of discrete lower segments 114d that are arranged in an array extending in a first direction 120 and a second direction 122. The upper segment 116 directly overlies the plurality of discrete lower segments 114d within the array. The upper segment 116 comprises sidewalls defining one or more cavities 113 respectively having a square shape. The square shaped cavities are surrounded by a continuous outer ring of the upper segment 116. A cross-shaped region of the upper segment 116 is surrounded by the continuous outer ring and separates the square shaped cavities along a first direction 120 and along a second direction 122. The cross-shaped region comprises a first cross-bar extending in the first direction 120 and a second cross-bar extending in the second direction 122.

FIG. 9C illustrates a top-view 908 of an integrated chip structure comprising a bond pad 112 having a lower segment 114 and an upper segment 116. The lower segment 114 comprises a plurality of discrete lower segments 114d that are arranged in an array extending in a first direction 120 and a second direction 122. The upper segment 116 comprises a plurality of discrete upper segments 116d that are arranged in an array extending in the first direction 120 and the second direction 122. In some embodiments, the plurality of discrete lower segments 114d may have a smaller size than the plurality of discrete upper segments 116d. In some such embodiments, the plurality of discrete upper segments 116d may completely cover the plurality of discrete lower segments 114d.

Figure 10A:
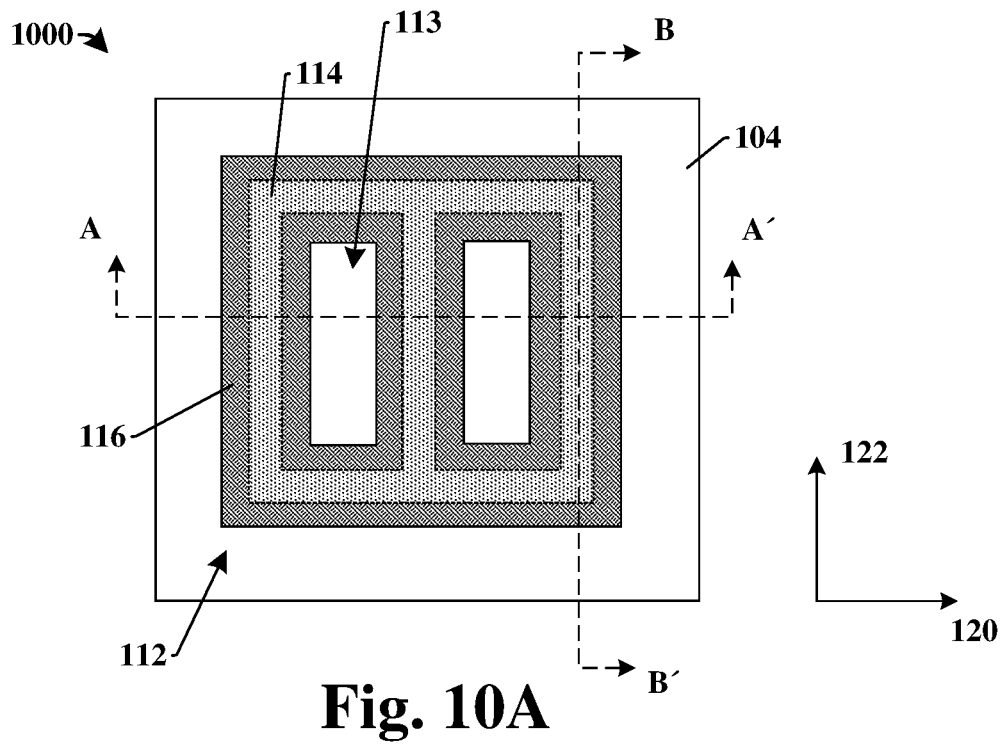
FIGS. 10A-10C illustrate some additional embodiments of an integrated chip structure comprising a disclosed bond pad having one or more cavities.

FIG. 10A illustrates a top-view of some additional embodiments of an integrated chip structure 1000 comprising a disclosed bond pad having one or more cavities.

The integrated chip structure 1000 comprises a bond pad 112 arranged within a dielectric structure 104. The bond pad 112 comprises a lower segment 114 and an upper segment 116 over the lower segment 114. The lower segment 114 and the upper segment 116 respectively comprise interior sidewalls defining one or more cavities 113 that are filled with the dielectric structure 104. In some embodiments, the one or more cavities 113 respectively have a rectangular shape. The lower segment 114 and the upper segment 116 continuously extend in a closed loop around the one or more cavities 113. In some embodiments, the lower segment 114 is completely covered by the upper segment 116. In some such embodiments, the interior sidewalls of the lower segment 114 are separated by a larger distance along the first direction and along the second direction than the interior sidewalls of the upper segment 116.

In some embodiments, the upper segment 116 comprises an upper outer ring segment surrounding the one or more cavities 113 and an upper cross-bar extending between parts of the upper outer ring segment. The lower segment 114 continuously extends in a closed loop around the one or more cavities 113. In some embodiments, the lower segment 114 comprises a lower outer ring segment surrounding the one or more cavities and a lower cross-bar extending between parts of the lower outer ring segment. The upper outer ring segment is directly over the lower outer ring segment and the upper cross-bar is directly over the lower cross-bar. The one or more cavities 113 are filled with the dielectric structure 104.

Figure 10B:
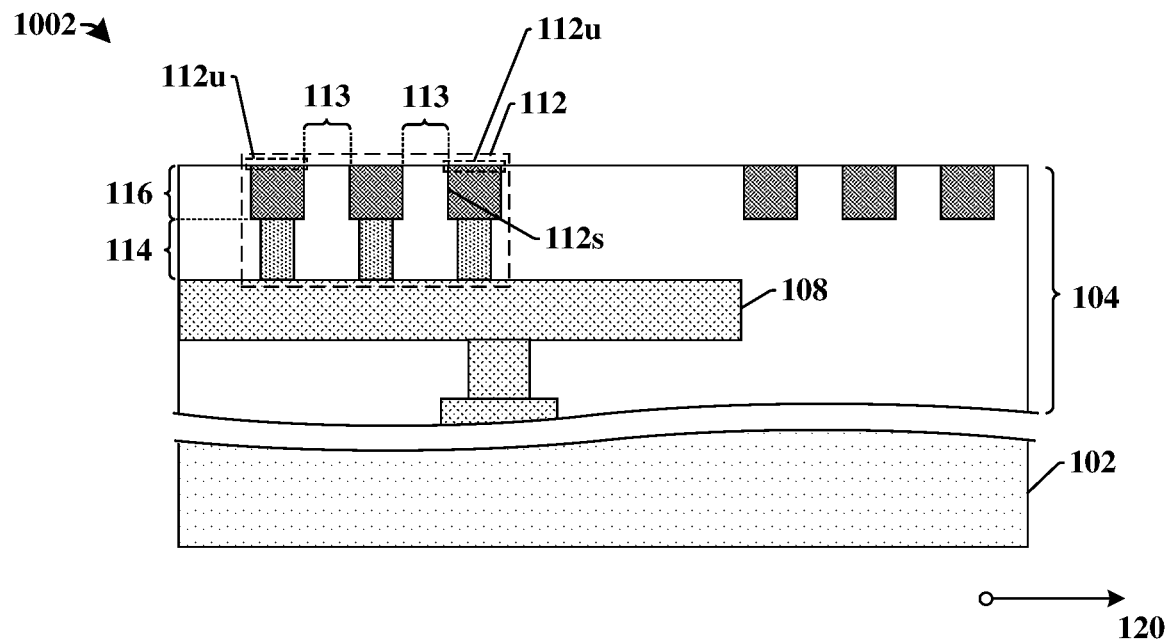

FIG. 10B illustrates a cross-sectional view 1002 of some additional embodiments of the integrated chip structure 1000 of FIG. 10A taken along line A-A'.

As shown in cross-sectional view 1002, the bond pad 112 comprises a lower segment 114 having discrete upper surfaces and an upper segment 116 having discrete lower surfaces. The plurality of discrete upper surfaces and the plurality of discrete lower surfaces are separated from one another by the dielectric structure 104 along the first direction 120.

Figure 10C:
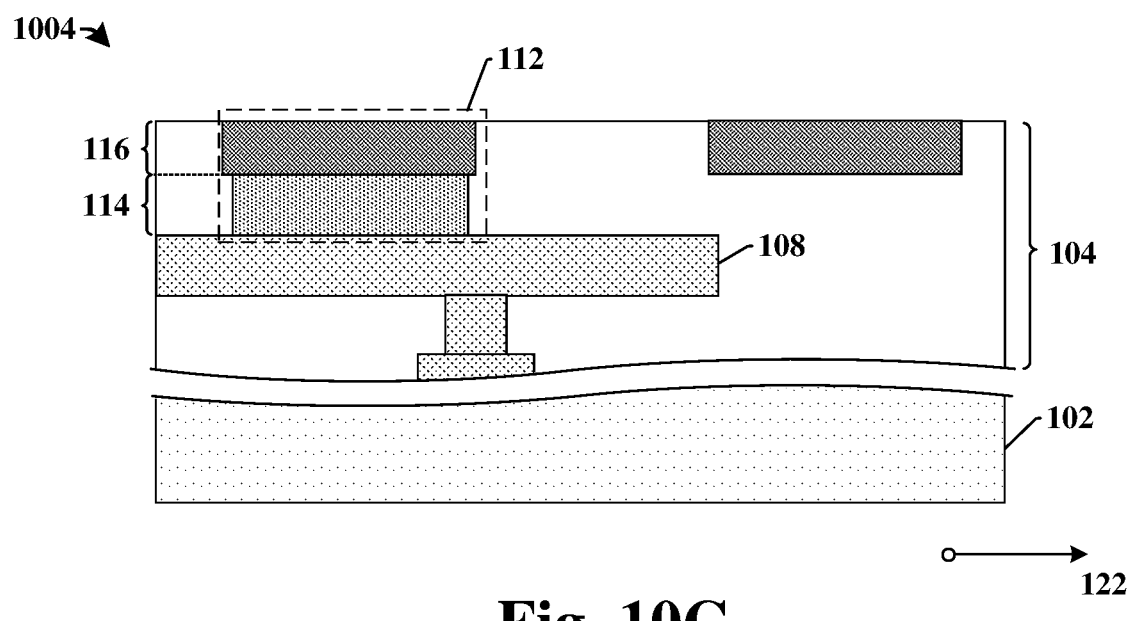

FIG. 10C illustrates a cross-sectional view 1004 of some additional embodiments of the integrated chip structure of FIG. 10A taken along line B-B'.

As shown in cross-sectional view 1004, the bond pad 112 comprises a lower segment 114 having a lower surface and an upper surface that respectively extend between outer edges of lower sidewalls coupled to the lower surface. The bond pad 112 further comprises an upper segment 116 having a lower surface and an upper surface that respectively extend between outer edges of upper sidewalls coupled to the top surface. In some embodiments, the lower surface of the upper segment 116 continuously extends past opposing sides of the upper surface of the lower segment 114.

FIGS. 11-18 illustrate some embodiments of a method of forming an integrated chip structure comprising a disclosed bond pad having one or more cavities configured to reduce dishing of the bond pad. Although FIGS. 11-18 are described in relation to a method, it will be appreciated that the structures disclosed in FIGS. 11-18 are not limited to such a method, but instead may stand alone as structures independent of the method.

Figure 11:
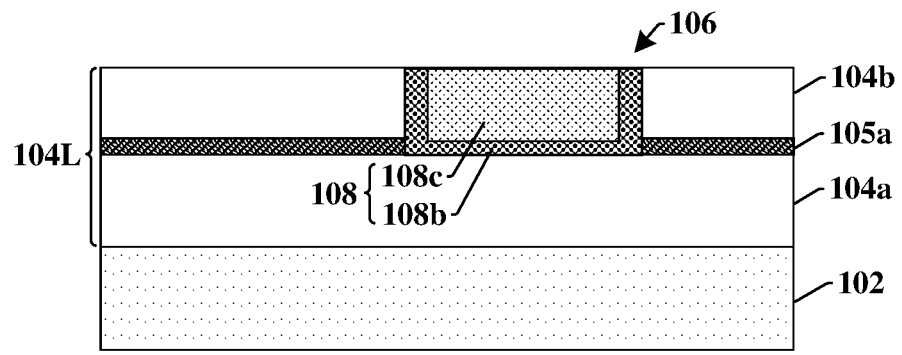
FIGS. 11-18 illustrate some embodiments of a method of forming an integrated chip structure comprising a disclosed bond pad having one or more cavities configured to reduce dishing of the bond pad.

As shown in cross-sectional view 1100 of FIG. 11, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments (not shown), one or more semiconductor devices are formed on and/or within the substrate 102. In various embodiments, the one or more semiconductor devices may comprise a transistor device, an image sensor device, a MEMS device, and/or the like.

One or more interconnects 106 are formed within a lower dielectric structure 104L formed over the substrate 102. The lower dielectric structure 104L may comprise one or more lower inter-level dielectric (ILD) layers 104a-104b separated by one or more etch stop layers 105a. In some embodiments, the one or more interconnects 106 may comprise a topmost interconnect 108 comprising a barrier layer 108b and a conductive core 108c. In some embodiments, the topmost interconnect 108 may be formed using a damascene process (e.g., a single damascene process or a dual damascene process). The damascene process is performed by forming an ILD layer on the substrate 102, etching the ILD layer to form a via hole and/or a trench, filling the via hole and/or the trench with a barrier layer and with a conductive material, and performing a planarization process (e.g., a CMP process). In some embodiments, the lower dielectric structure 104L may comprise silicon dioxide, carbon doped silicon dioxide, silicon oxynitride, BSG, PSG, BPSG, FSG, a porous dielectric material, or the like. In some embodiments, the lower dielectric structure 104L may be formed by one or more deposition processes (e.g., a physical vapor deposition (PVD) process, a chemical vapor deposition (CVD) process, a plasma enhanced chemical vapor deposition (PE-CVD) process, an atomic layer deposition (ALD) process, etc.) and the conductive material (e.g., tungsten, copper, aluminum, or the like) may be formed using a deposition process and/or a plating process (e.g., electro-plating, electro-less plating, etc.).

Figure 12:
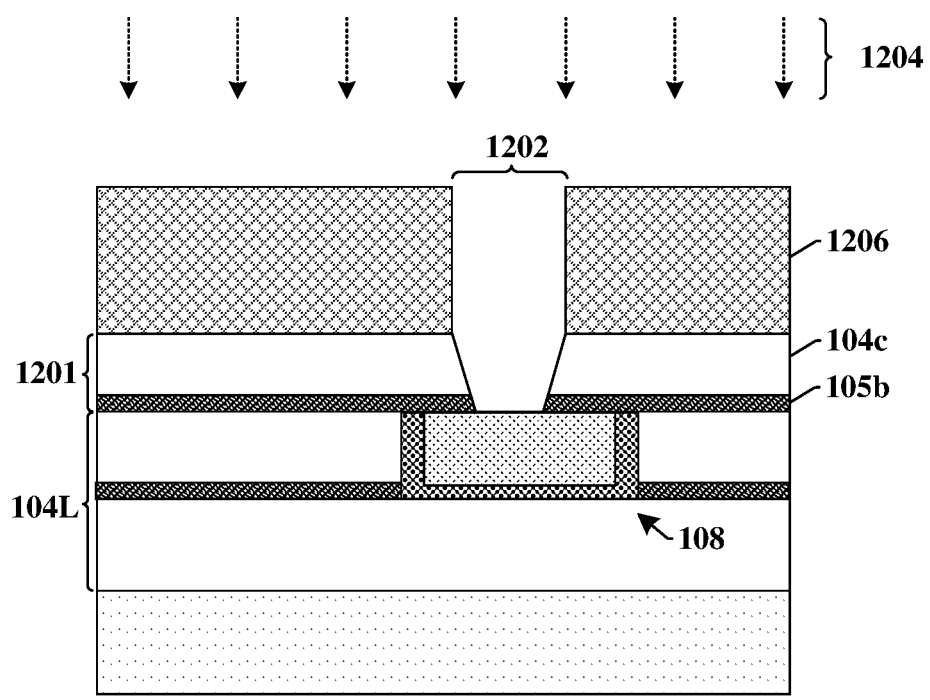

As shown in cross-sectional view 1200 of FIG. 12, a first upper dielectric structure 1201 is formed over the lower dielectric structure 104L. In some embodiments, the first upper dielectric structure 1201 comprises a first bond pad etch stop layer 105b formed over the lower dielectric structure 104L and a first bond pad ILD layer 104c formed on the first bond pad etch stop layer 105b. In some embodiments, the first bond pad etch stop layer 105b may comprise a nitride (e.g., silicon nitride, silicon oxynitride, etc.), a carbide (e.g., silicon carbide, silicon oxycarbide, etc.), or the like. In some embodiments, the first bond pad ILD layer 104c may comprise silicon dioxide, carbon doped silicon dioxide, silicon oxynitride, BSG, PSG, BPSG, FSG, a porous dielectric material, or the like. In some embodiments, the first bond pad etch stop layer 105b and the first bond pad ILD layer 104c may be formed by way of deposition processes (e.g., a PVD process, a CVD process, a PE-CVD process, an ALD process, etc.).

A first bond pad opening 1202 is formed within the first upper dielectric structure 1201. In some embodiments, the first bond pad opening 1202 may be formed according to a first patterning process. In some embodiments, the first patterning process may be performed by selectively exposing the first upper dielectric structure 1201 to a first etchant 1204 according to a first mask 1206. The first patterning process forms sidewalls of first upper dielectric structure 1201, which define the first bond pad opening 1202. In some embodiments, the first etchant 1204 may comprise a plasma etchant having a fluorine based etching chemistry (e.g., a $SF_6$ plasma, or the like). In some embodiments, the first mask 1206 may comprise a photosensitive material (e.g., a photoresist), a hard mask, or the like.

Figure 13:
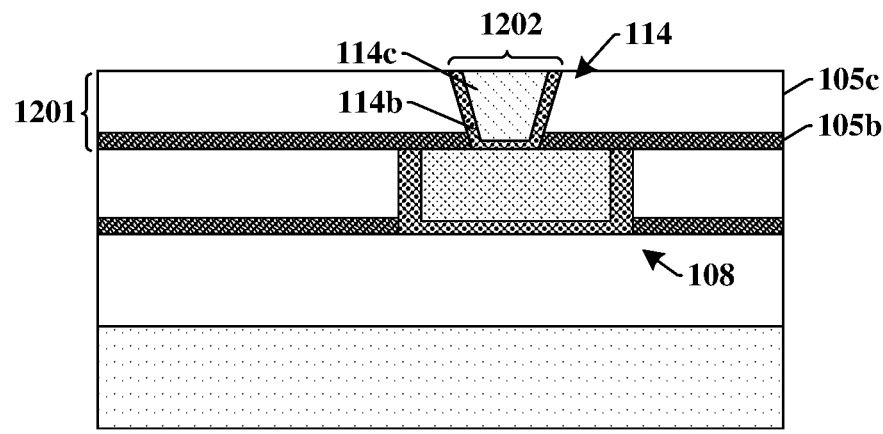

As shown in cross-sectional view 1300 of FIG. 13, a first barrier layer 114b and a first conductive core 114c are formed within the first bond pad opening 1202. In such embodiments, the first barrier layer 114b may be formed along interior surfaces of the first upper dielectric structure 1201 defining the first bond pad opening 1202. The first conductive core 114c may be subsequently formed over the first barrier layer 114b and within the first bond pad opening 1202. In some embodiments, the first barrier layer 114b may be formed by way of a deposition process (e.g., a PVD process, a CVD process, a PE-CVD process, an ALD process, etc.). In some embodiments, the first conductive core 114c may be formed by depositing a first conductive material using a deposition process and/or a plating process (e.g., electroplating, electro-less plating, etc.). In various embodiments, the first barrier layer 114b may comprise titanium, tantalum, titanium nitride, tantalum nitride, or the like. In various embodiments, the first conductive material may comprise copper, aluminum, tungsten, or the like. After depositing the first conductive material within the first bond pad opening 1202, a planarization process may be performed to remove excess of the first conductive material from over the first upper dielectric structure 1201 and to define a lower segment 114 of a bond pad. In some embodiments, the planarization process may comprise a chemical mechanical polishing (CMP) process. In other embodiments, the planarization process may comprise an etching process and/or a grinding process, for example.

Figure 14:
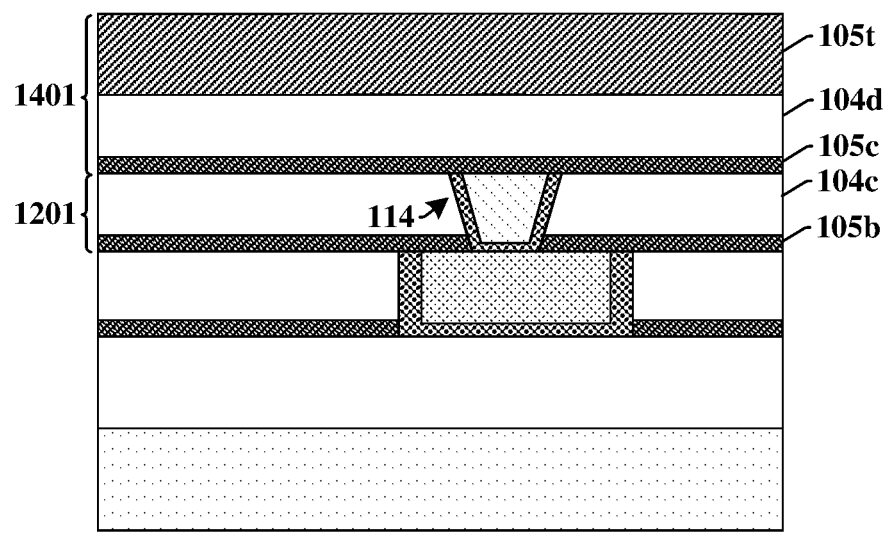

As shown in cross-sectional view 1400 of FIG. 14, a second upper dielectric structure 1401 is formed over the first upper dielectric structure 1201. In some embodiments, the second upper dielectric structure 1401 comprises a second bond pad etch stop layer 105c formed over the first bond pad ILD layer 104c, a second bond pad ILD layer 104d formed on the second bond pad etch stop layer 105c, and a top dielectric layer 105t formed on the second bond pad ILD layer 104d. In some embodiments, the second bond pad etch stop layer 105c and/or the top dielectric layer 105t may comprise a nitride (e.g., silicon nitride, silicon oxynitride, etc.), a carbide (e.g., silicon carbide, silicon oxycarbide, etc.), or the like. In some embodiments, the second bond pad ILD layer 104d may comprise silicon dioxide, carbon doped silicon dioxide, silicon oxynitride, BSG, PSG, BPSG, FSG, a porous dielectric material, or the like. In some embodiments, the second bond pad etch stop layer 105c, the second bond pad ILD layer 104d, and the top dielectric layer 105t may be formed by way of deposition processes (e.g., a PVD process, a CVD process, a PE-CVD process, an ALD process, etc.).

Figure 15:
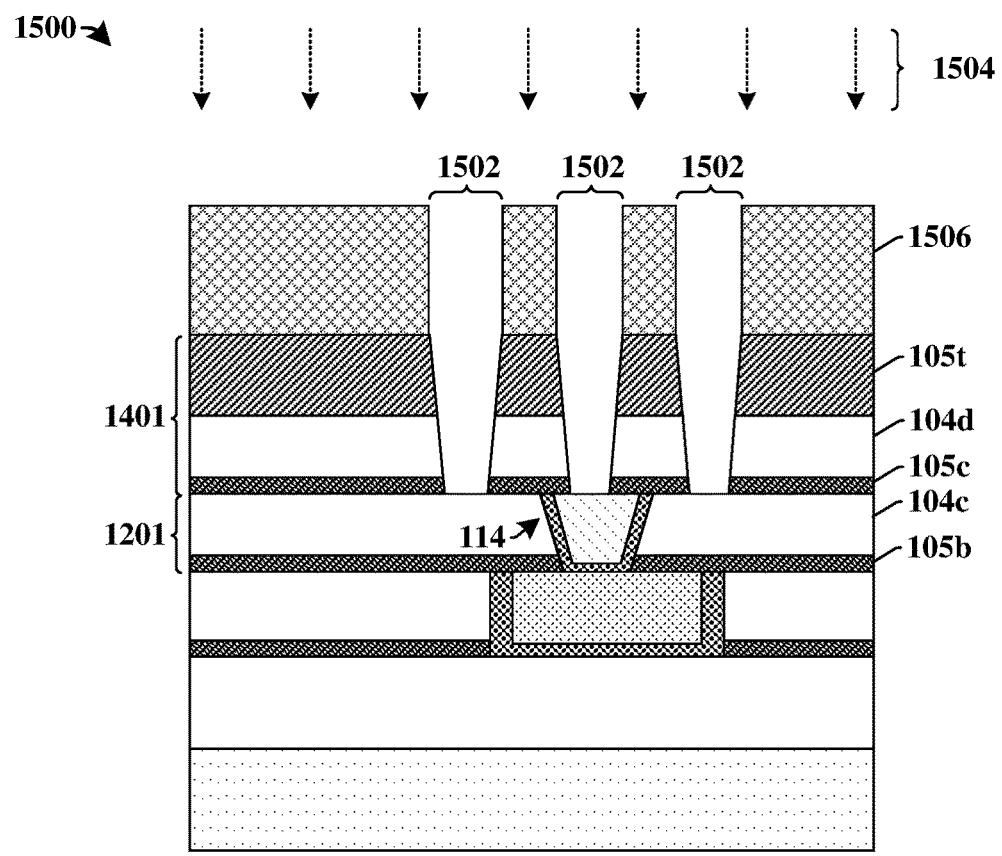

As shown in cross-sectional view 1500 of FIG. 15, a second bond pad opening 1502 is formed within the second upper dielectric structure 1401. In some embodiments, the second bond pad opening 1502 may be formed according to a second patterning process. In some embodiments, the second patterning process may be performed by selectively exposing the second upper dielectric structure 1401 to a second etchant 1504 according to a second mask 1506. The second patterning process forms sidewalls of the second upper dielectric structure 1401 that define the second bond pad opening 1502. In some embodiments, the second etchant 1504 may comprise a plasma etchant having a fluorine based etching chemistry (e.g., a $SF_6$ plasma, or the like). In some embodiments, the second mask 1506 may comprise a photosensitive material (e.g., a photoresist), a hard mask, or the like.

Figure 16:
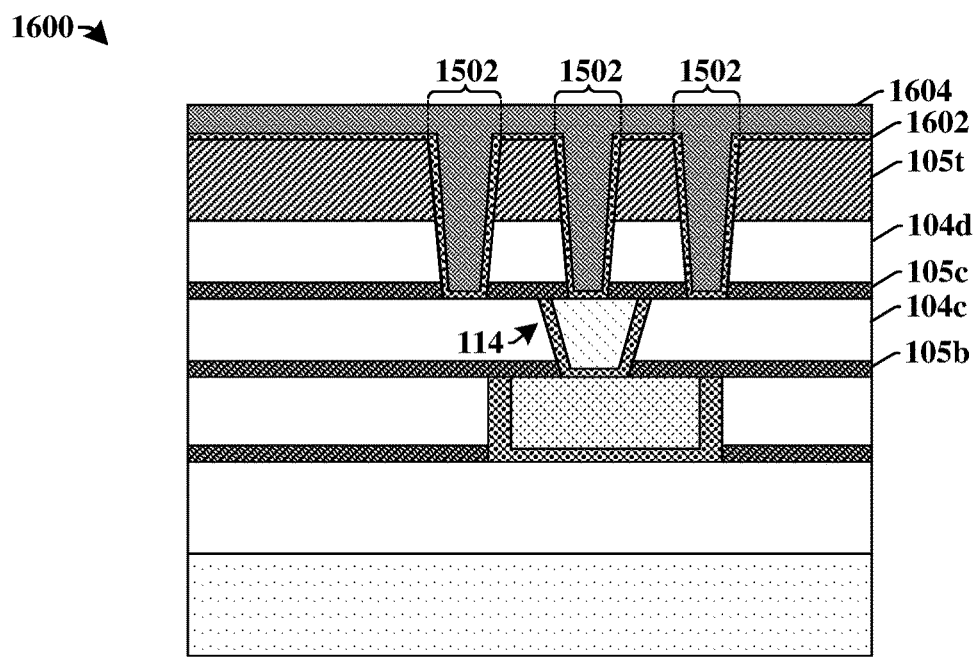

As shown in cross-sectional view 1600 of FIG. 16, a barrier material 1602 and a second conductive material 1604 are formed within the second bond pad opening 1502 and over the top dielectric layer 105t. The barrier material 1602 may be formed along interior surfaces defining the second bond pad opening 1502. The second conductive material 1604 may be subsequently formed over the barrier material 1602 and within the second bond pad opening 1502. In some embodiments, the barrier material 1602 may be formed by way of a deposition process (e.g., a PVD process, a CVD process, a PE-CVD process, an ALD process, etc.). In some embodiments, the second conductive material 1604 may be formed by way of a deposition process and/or a plating process (e.g., electroplating, electro-less plating, etc.). In various embodiments, the barrier material 1602 may comprise titanium, tantalum, titanium nitride, tantalum nitride, or the like. In various embodiments, the second conductive material may comprise copper, aluminum, tungsten, or the like.

Figure 17A:
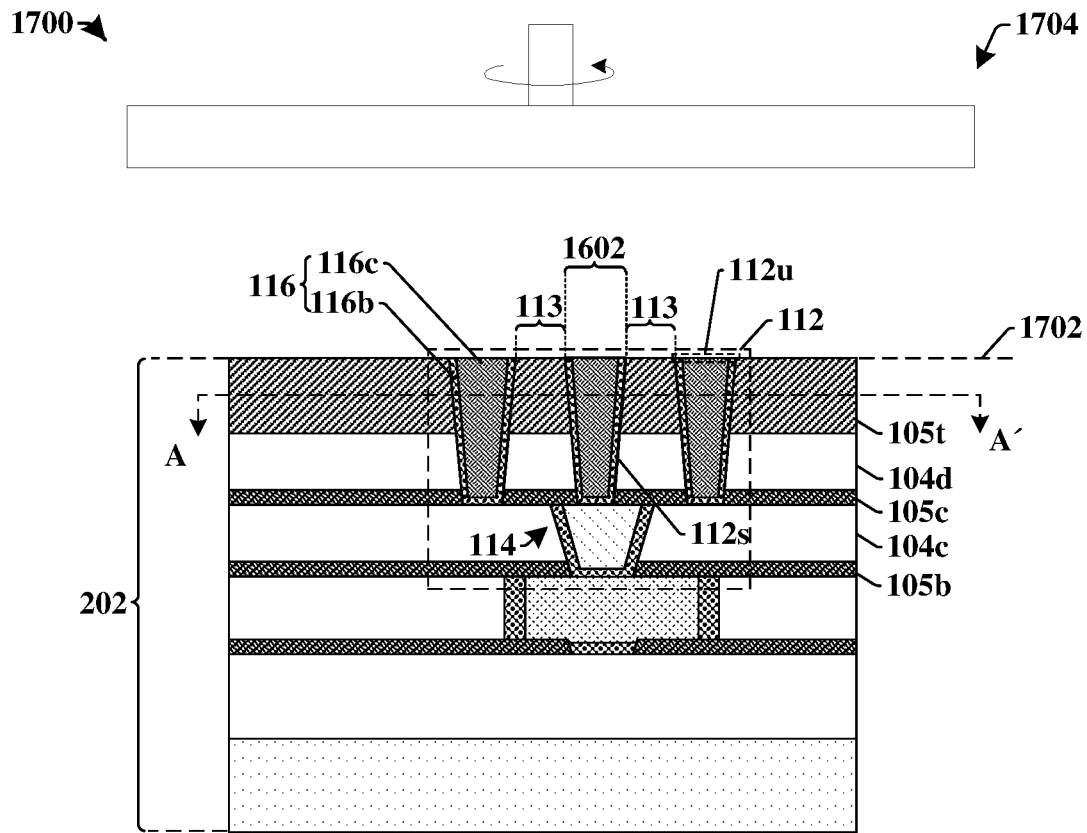
Figure 17B:
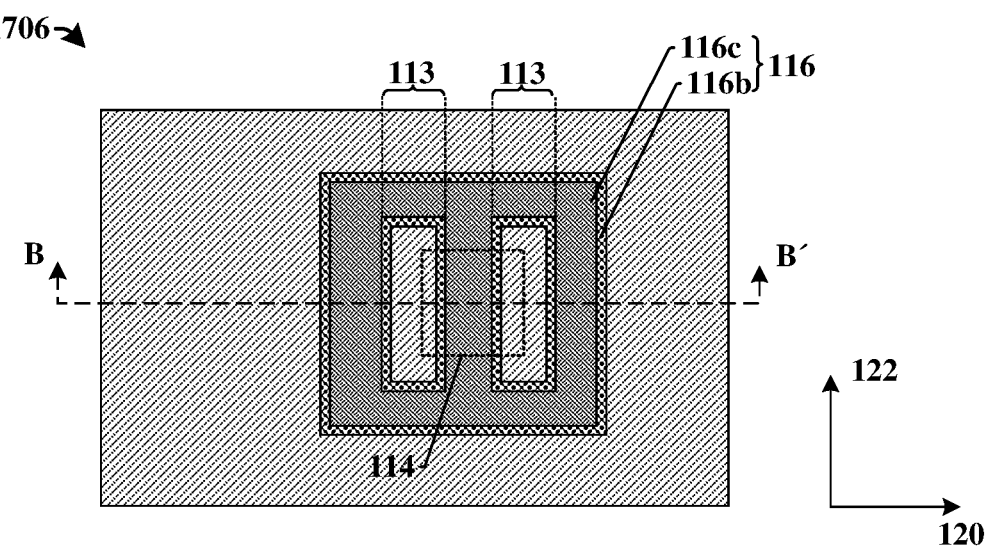

As shown in cross-sectional view 1700 of FIG. 17A and top-view 1706 of FIG. 17B, after forming the second conductive material (e.g., 1604 of FIG. 16) within the second bond pad opening (e.g., 1502 of FIG. 16), a planarization process may be performed (along line 1702). The planarization process removes excess of the second conductive material from over the top dielectric layer 105t to define an upper segment 116 of a bond pad 112 on a first IC die 202. The upper segment 116 of the bond pad 112 comprises a second barrier layer 116b and a second conductive core 116c over the second barrier layer 116b. The upper segment 116 of the bond pad 112 comprises a top surface having a plurality of discrete top surface segments 112u that are laterally separated from one another by one or more cavities 113 defined by interior sidewalls of the bond pad 112, as viewed in the cross-sectional view 1700. The one or more cavities 113 are filled with the second upper dielectric structure (e.g., the top dielectric layer 105t, the second bond pad ILD layer 104d, and the second bond pad etch stop layer 105c).

In some embodiments, the planarization process may comprise a chemical mechanical polishing (CMP) process. During the CMP process an upper surface of the first IC die 202 is brought into contact with a polishing pad 1704, so that the top dielectric layer 105t and the upper segment 116 of the bond pad 112 are brought into contact with the polishing pad 1704. Because the top dielectric layer 105t is disposed directly between interior sidewalls of the upper segment 116 of the bond pad 112, an overlap between the polishing pad 1704 and individual ones of the plurality of discrete top surface segments 112u is reduced. Reducing the overlap between the polishing pad 1704 and individual ones of the plurality of discrete top surface segments 112u reduces a dishing of individual ones of the plurality of discrete top surface segments 112u.

Figure 18:
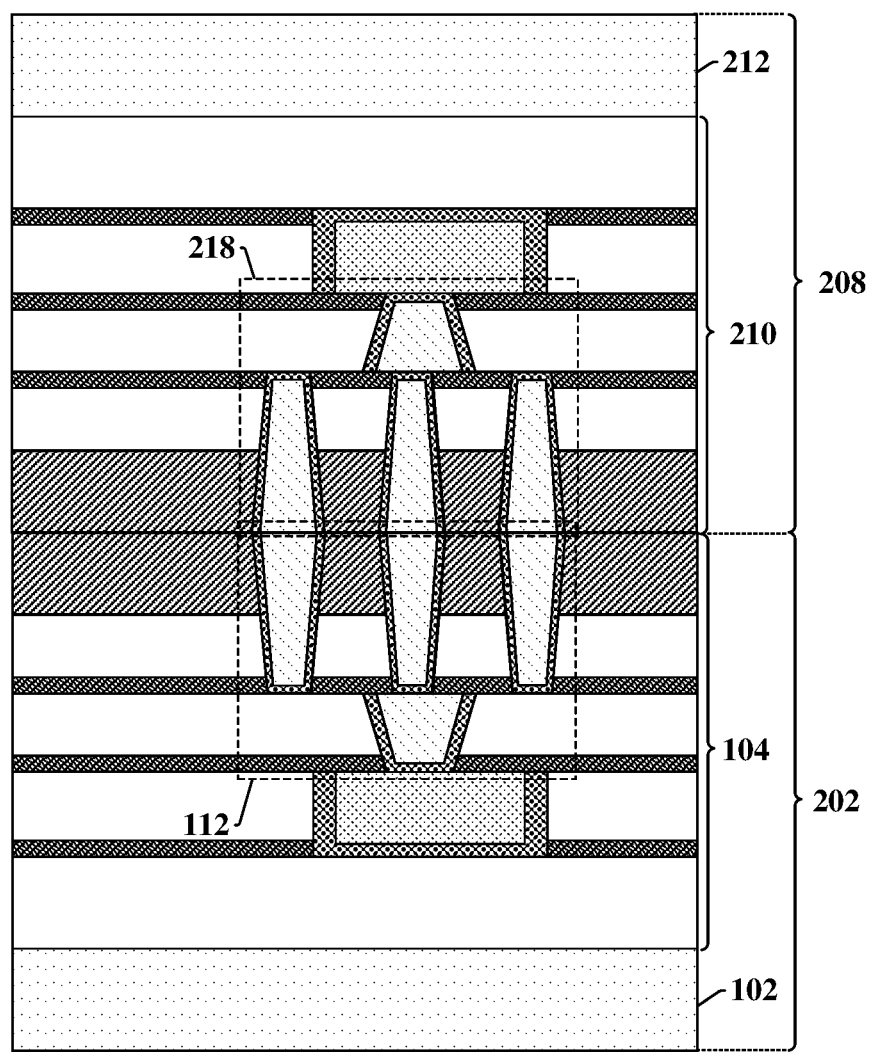

As shown in cross-sectional view 1800 of FIG. 18, the bond pad 112 of first IC die 202 is bonded to the additional bond pad 218 of a second IC die 208 to form a multi-dimensional integrated chip structure. During bonding, the plurality of discrete top surface segments of the bond pad 112 are brought into contact with a plurality of discrete segments of the additional bond pad 218. Furthermore, top surfaces of the dielectric structure 104 are brought into contact with surfaces of an additional dielectric structure 210 of the second IC die 208, so as to form a hybrid bonding interface between the first IC die 202 and the second IC die 208. The reduced dishing of the plurality of discrete top surface segments of the bond pad 112 decreases formation of voids between the bond pad 112 and the additional bond pad 218, thereby improving an electrical performance and/or a reliability of the multi-dimensional integrated chip structure.

FIGS. 19-28 illustrate some additional embodiments of a method of forming an integrated chip structure comprising a disclosed bond pad having one or more cavities configured to reduce dishing of the bond pad. Although FIGS. 19-28 are described in relation to a method, it will be appreciated that the structures disclosed in FIGS. 19-28 are not limited to such a method, but instead may stand alone as structures independent of the method.

Figure 19:
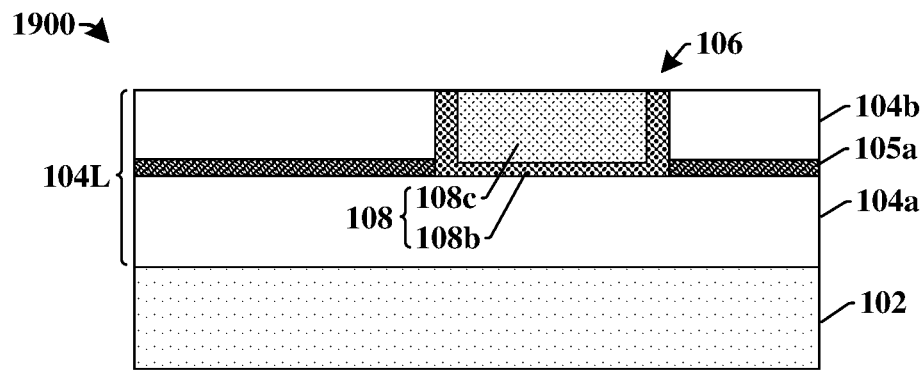
FIGS. 19-28 illustrate some additional embodiments of a method of forming an integrated chip structure comprising a disclosed bond pad having one or more cavities configured to reduce dishing of the bond pad.

As shown in cross-sectional view 1900 of FIG. 19, a substrate 102 is provided. One or more interconnects 106 are formed within a lower dielectric structure 104L formed over a substrate 102. In some embodiments, the one or more interconnects 106 may comprise a topmost interconnect 108 comprising a barrier layer 108b and a conductive core 108c.

Figure 20:
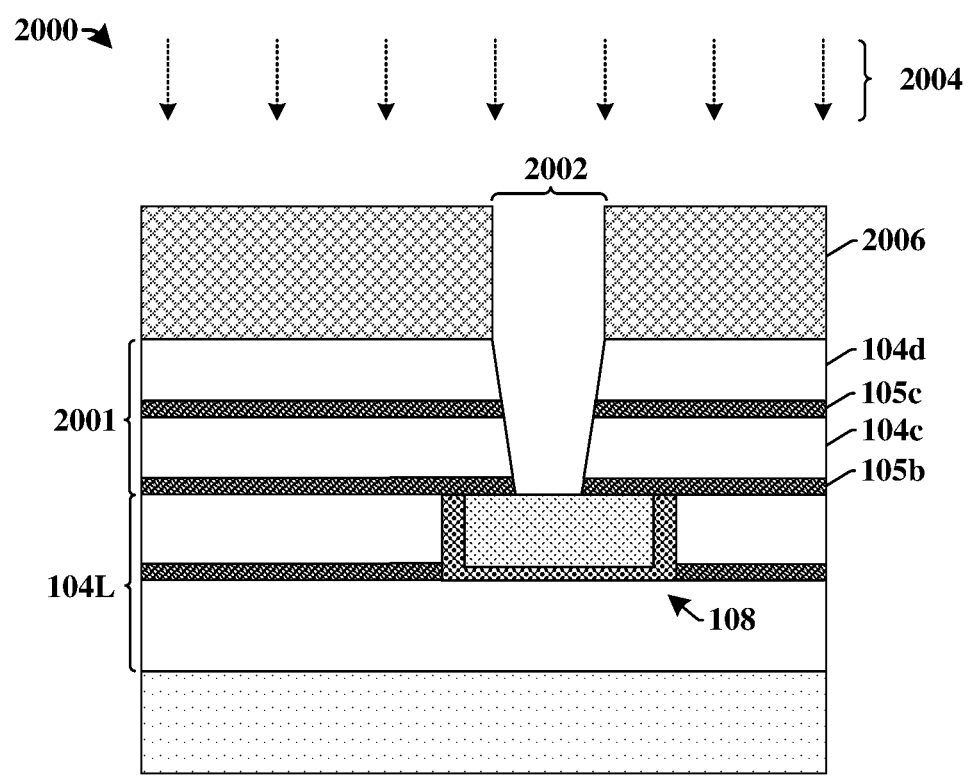

As shown in cross-sectional view 2000 of FIG. 20, a first upper dielectric structure 2001 is formed over the lower dielectric structure 104L. In some embodiments, the first upper dielectric structure 2001 comprises a first bond pad etch stop layer 105b formed over the lower dielectric structure 104L, a first bond pad ILD layer 104c formed on the first bond pad etch stop layer 105b, a second bond pad etch stop layer 105c formed on the first bond pad ILD layer 104c, and a second bond pad ILD layer 104d formed on the second bond pad etch stop layer 105c.

An intermediate first bond pad opening 2002 is formed within the first upper dielectric structure 2001. In some embodiments, the intermediate first bond pad opening 2002 may be formed according to a first patterning process. In some embodiments, the first patterning process may be performed by selectively exposing the first upper dielectric structure 2001 to a first etchant 2004 according to a first mask 2006.

Figure 21:
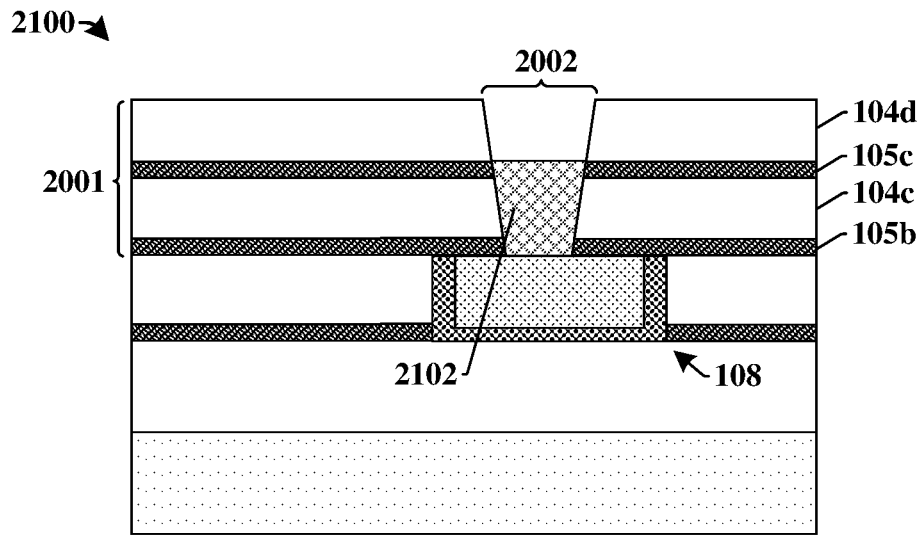

As shown in cross-sectional view 2100 of FIG. 21, a sacrificial mask 2102 is formed within the intermediate first bond pad opening 2002. The sacrificial mask 2102 may comprise a dielectric material, a photoresist material, or the like.

Figure 22:
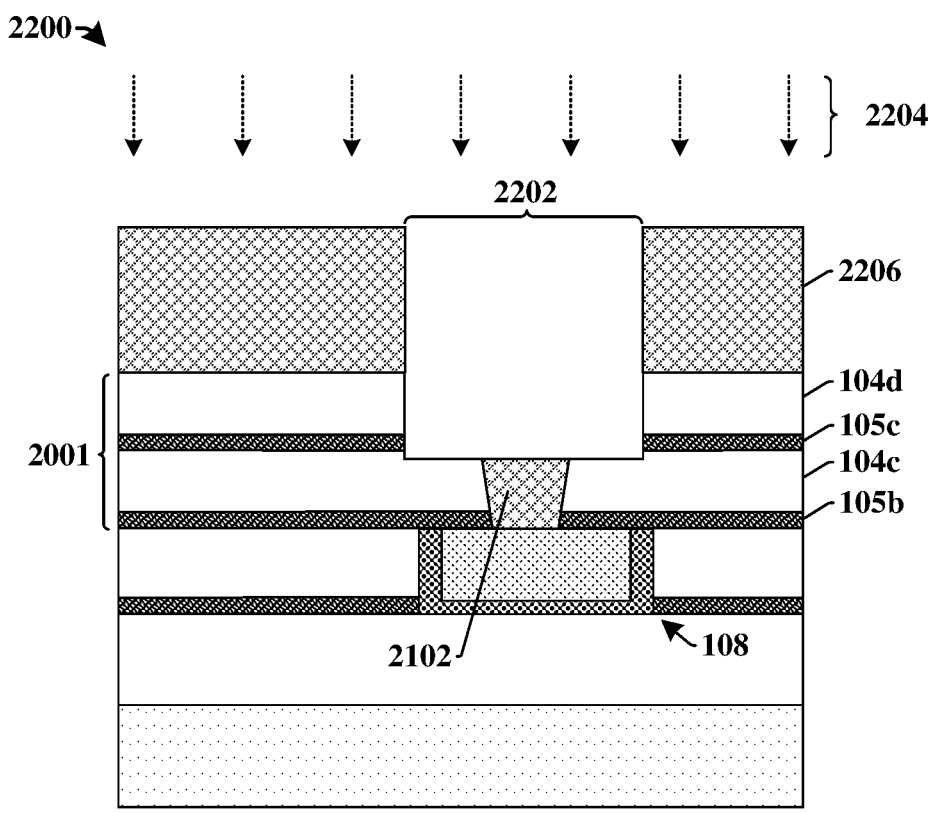

As shown in cross-sectional view 2200 of FIG. 22, a first bond pad opening 2202 is formed within the first upper dielectric structure 2001. In some embodiments, the first bond pad opening 2202 may be formed according to a second patterning process. In some embodiments, the second patterning process may be performed by selectively exposing the first upper dielectric structure 2001 to a second etchant 2204 according to a second mask 2206.

Figure 23:
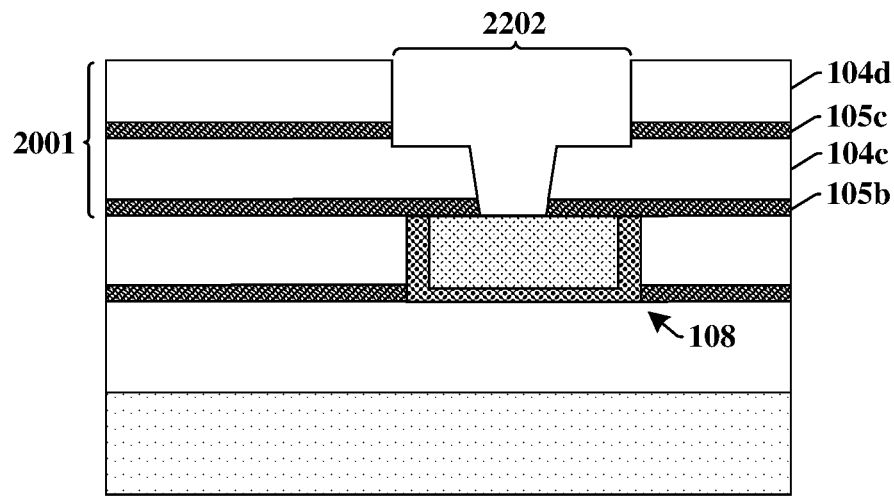

As shown in cross-sectional view 2300 of FIG. 23, the sacrificial mask (e.g., 2102 of FIG. 22) is removed from within the first bond pad opening 2202. In various embodiments, the sacrificial mask 2102 may be removed by way of a chemical developer, an etching process, or the like.

Figure 24:
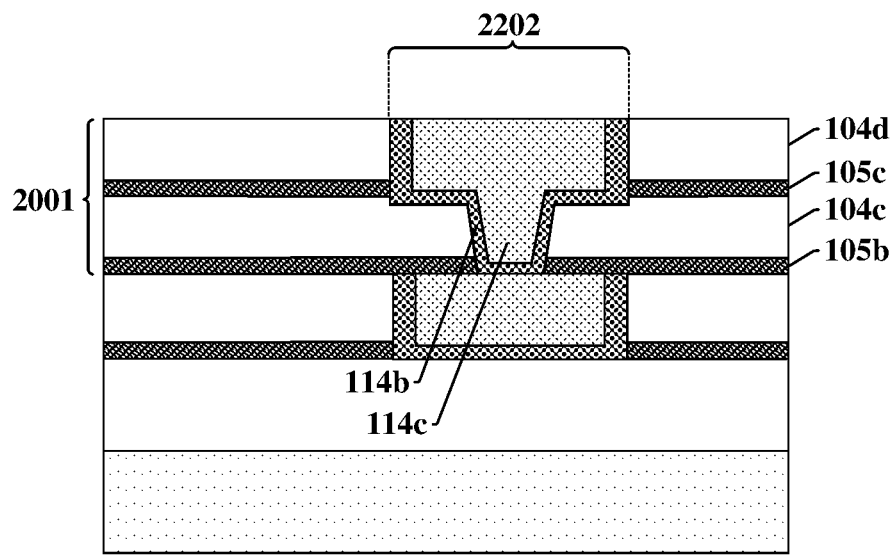

As shown in cross-sectional view 2400 of FIG. 24, a first barrier layer 114b is formed within the first bond pad opening 2202 and a first conductive core 114c is formed on the first barrier layer 114b and within the first bond pad opening 2202. In such embodiments, the first barrier layer 114b may be formed along interior surfaces defining the first bond pad opening 2202. The first conductive core 114c may be subsequently formed over the barrier layer 114b and within the first bond pad opening 2202.

Figure 25:
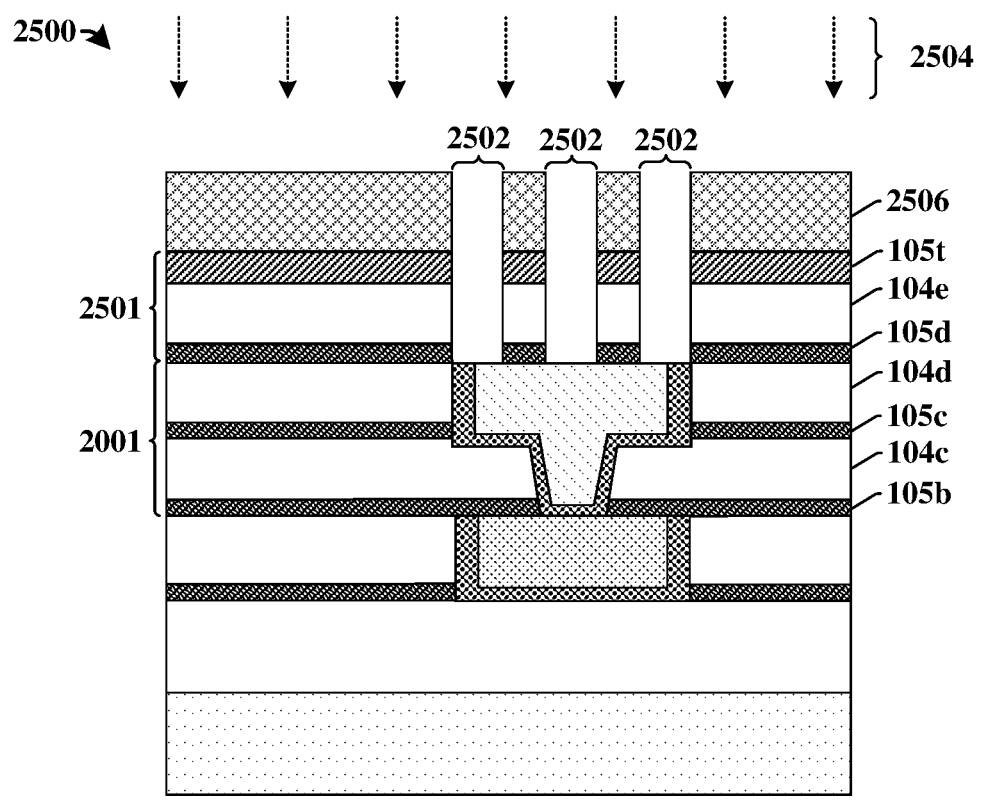

As shown in cross-sectional view 2500 of FIG. 25, a second upper dielectric structure 2501 is formed over the first upper dielectric structure 2001. In some embodiments, the second upper dielectric structure 2501 comprises a third bond pad etch stop layer 105d formed over the second bond pad ILD layer 104d, a third bond pad ILD layer 104e formed on the third bond pad etch stop layer 105d, and a top dielectric layer 105t formed over the third bond pad ILD layer 104e.

A second bond pad opening 2502 is formed within the second upper dielectric structure 2501. In some embodiments, the second bond pad opening 2502 may be formed according to a third patterning process. In some embodiments, the third patterning process may be performed by selectively exposing the second upper dielectric structure 2501 to a third etchant 2504 according to a third mask 2506. The third patterning process forms sidewalls of the second upper dielectric structure 2501 that define the second bond pad opening 2502.

Figure 26:
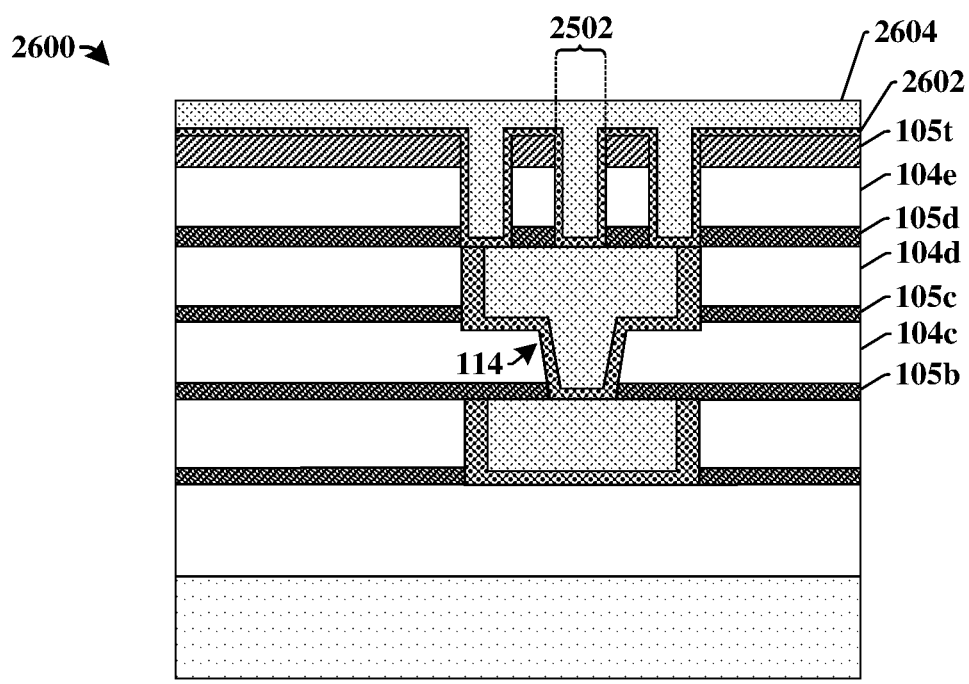

As shown in cross-sectional view 2600 of FIG. 26, a barrier material 2602 and a conductive material 2604 are formed within the second bond pad opening 2502 and over the top dielectric layer 105t. In such embodiments, the barrier material 2602 may be formed along interior surfaces defining the second bond pad opening 2502. The conductive material 2604 may be subsequently formed over the barrier material 2602 and within the second bond pad opening 2502.

Figure 27A:
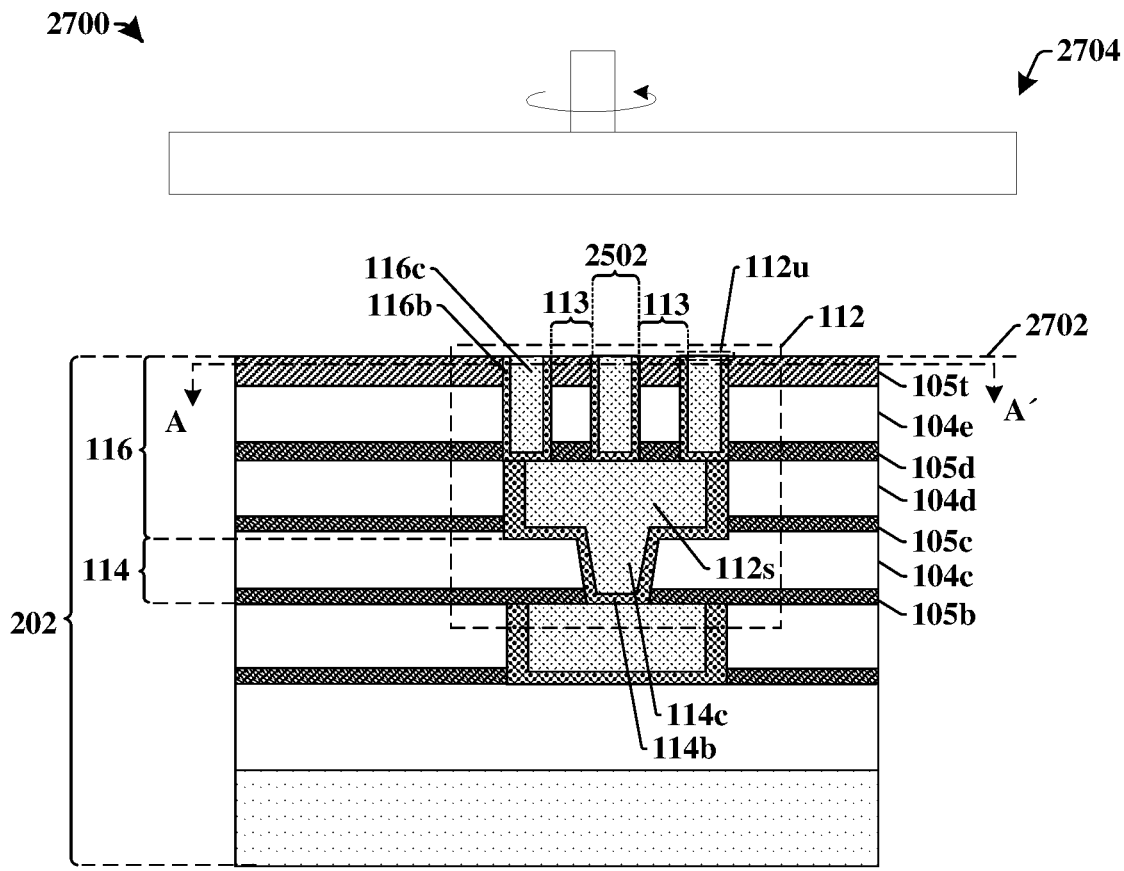
Figure 27B:
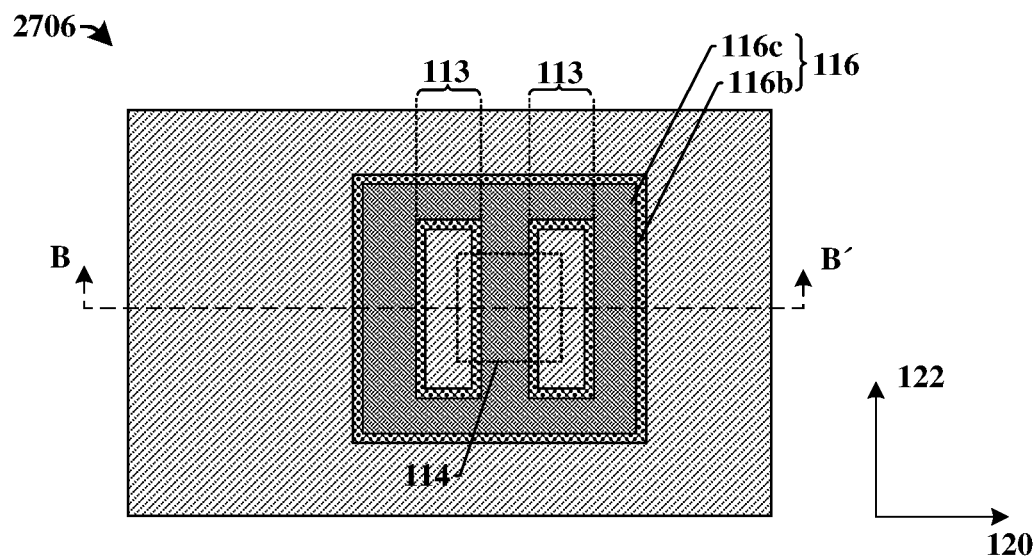

As shown in cross-sectional view 2700 of FIG. 27A and top-view 2706 of FIG. 27B, after forming the conductive material (e.g., 2604 of FIG. 26) within the second bond pad opening 2502, a planarization process may be performed (along line 2702). The planarization process removes excess of the conductive material from over the second upper dielectric structure to define an upper segment 116 of a bond pad 112 on a first IC die 202. The upper segment 116 of the bond pad 112 comprises a part of the first barrier layer 114b, a part of the first conductive core 114c, a second barrier layer 116b, and a second conductive core 116c over the second barrier layer 116b. The upper segment 116 of the bond pad 112 comprises a top surface comprises a plurality of discrete top surface segments 112u that are laterally separated from one another by one or more cavities 113 that are defined by interior sidewalls of the bond pad 112. The one or more cavities 113 are filled with the second upper dielectric structure.

In some embodiments, the planarization process may comprise a chemical mechanical polishing (CMP) process. During the CMP process an upper surface of the first IC die 202 is brought into contact with a polishing pad 2704, so that the top dielectric layer 105t and the upper segment 116 of the bond pad 112 are brought into contact with the polishing pad 2704. Because the top dielectric layer 105t is disposed directly between interior sidewalls of the upper segment 116 of the bond pad 112, an overlap between the polishing pad 2704 and individual ones of the plurality of discrete top surface segments 112u is reduced. Reducing the overlap between the polishing pad 1704 and individual ones of the plurality of discrete top surface segments 112u reduces a dishing of individual ones of the plurality of discrete top surface segments 112u.

Figure 28:
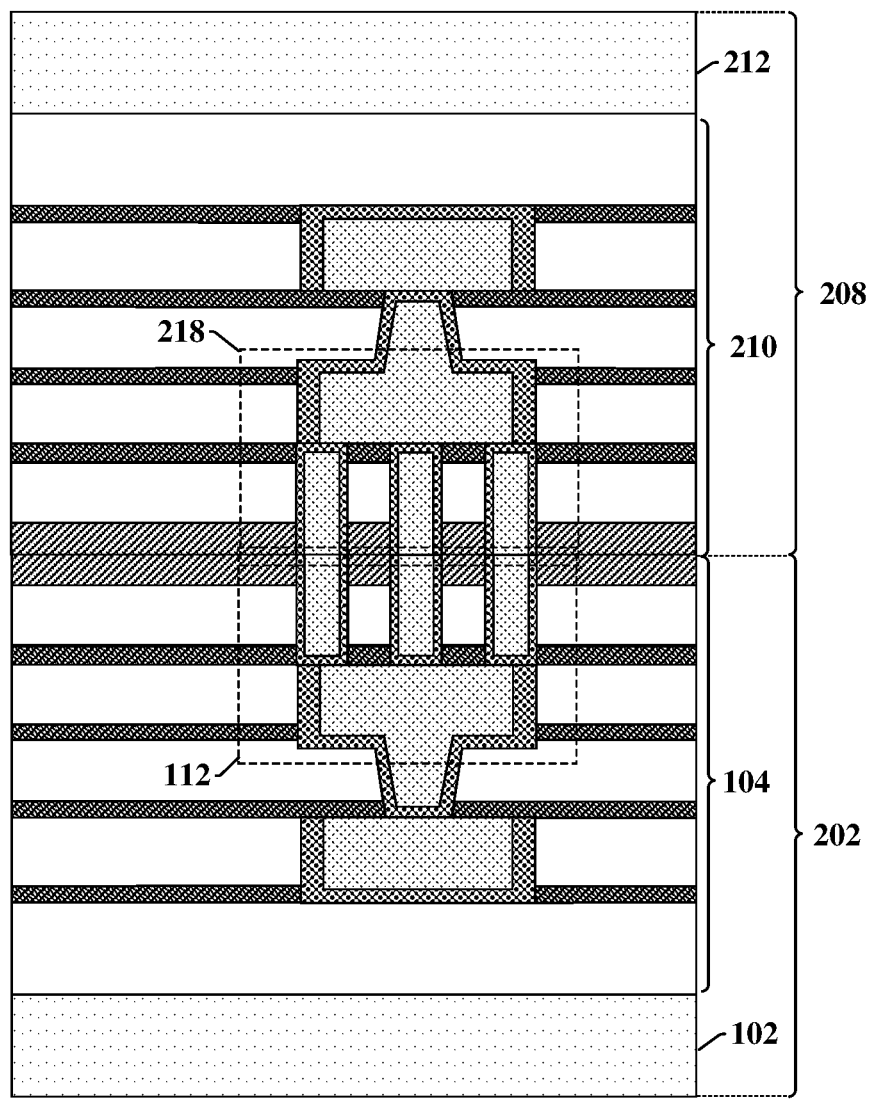

As shown in cross-sectional view 2800 of FIG. 28, the bond pad 112 of first IC die 202 is bonded to the additional bond pad 218 of a second IC die 208. During bonding, the plurality of discrete top surface segments of the bond pad 112 are brought into contact with a plurality of additional discrete segments of the additional bond pad 218. Furthermore, upper surfaces of the dielectric structure 104 are brought into contact with surfaces of an additional dielectric structure 210 of the second IC die 208, so as to form a hybrid bonding interface between the first IC die 202 and the second IC die 208.

In some alternative embodiments, the acts of FIGS. 25-27B may be omitted and a first die having a bond pad with the structure of FIG. 24 may be bonded to an additional die having a bond pad with the structure of FIG. 24 along a hybrid bonding interface (e.g., extending along tops of the first barrier layer 114b and the first conductive core 114c).

FIGS. 29-35 illustrate some additional embodiments of a method of forming an integrated chip structure comprising a disclosed bond pad having one or more cavities configured to reduce dishing of the bond pad. Although FIGS. 29-35 are described in relation to a method, it will be appreciated that the structures disclosed in FIGS. 29-35 are not limited to such a method, but instead may stand alone as structures independent of the method.

Figure 29:
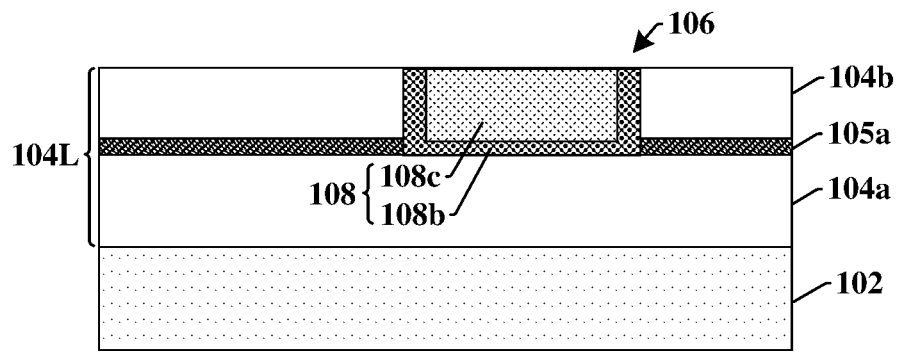
FIGS. 29-35 illustrate some additional embodiments of a method of forming an integrated chip structure comprising a disclosed bond pad having one or more cavities configured to reduce dishing of the bond pad.

As shown in cross-sectional view 2900 of FIG. 29, a substrate 102 is provided. One or more interconnects 106 are formed within a lower dielectric structure 104L formed over a substrate 102. In some embodiments, the one or more interconnects 106 may comprise a topmost interconnect 108 comprising a barrier layer 108b and a conductive core 108c.

Figure 30:
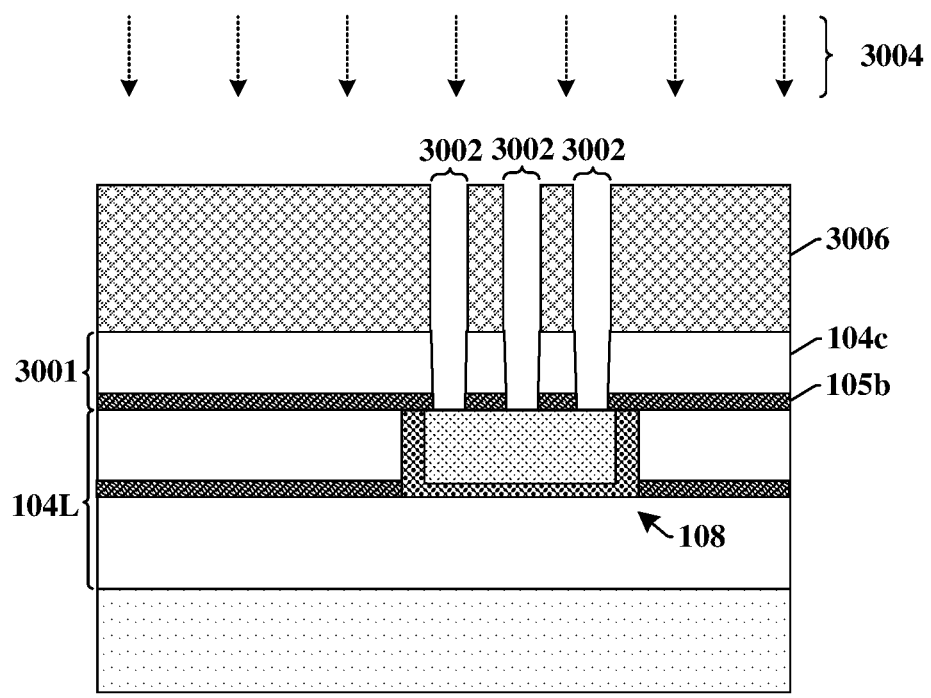

As shown in cross-sectional view 3000 of FIG. 30, a first upper dielectric structure 3001 is formed over the lower dielectric structure 104L. In some embodiments, the first upper dielectric structure 3001 comprises a first bond pad etch stop layer 105b formed over the lower dielectric structure 104L and a first bond pad ILD layer 104c formed on the first bond pad etch stop layer 105b. One or more first bond pad openings 3002 are formed within the first upper dielectric structure 3001. In some embodiments, the one or more first bond pad openings 3002 may be formed according to a first patterning process. In some embodiments, the first patterning process may be performed by selectively exposing the first upper dielectric structure 3001 to a first etchant 3004 according to a first mask 3006.

Figure 31A:
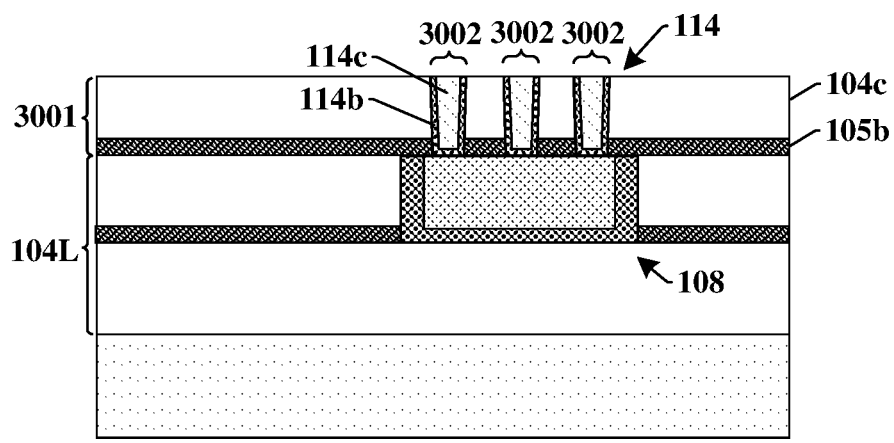

As shown in cross-sectional view 3100 of FIG. 31A, a first barrier layer 114b and a first conductive core 114c are formed within the one or more first bond pad openings 3002. In some embodiments, the first barrier layer 114b may be formed along interior surfaces of the first upper dielectric structure 3001 defining the one or more first bond pad openings 3002. The first conductive core 114c may be subsequently formed over the first barrier layer 114b and within the one or more first bond pad openings 3002. After depositing the first conductive material within the one or more first bond pad openings 3002, a planarization process may be performed to remove excess of the first conductive material from over the first upper dielectric structure 3001 and to define a lower segment 114 of a bond pad.

Figure 31B:
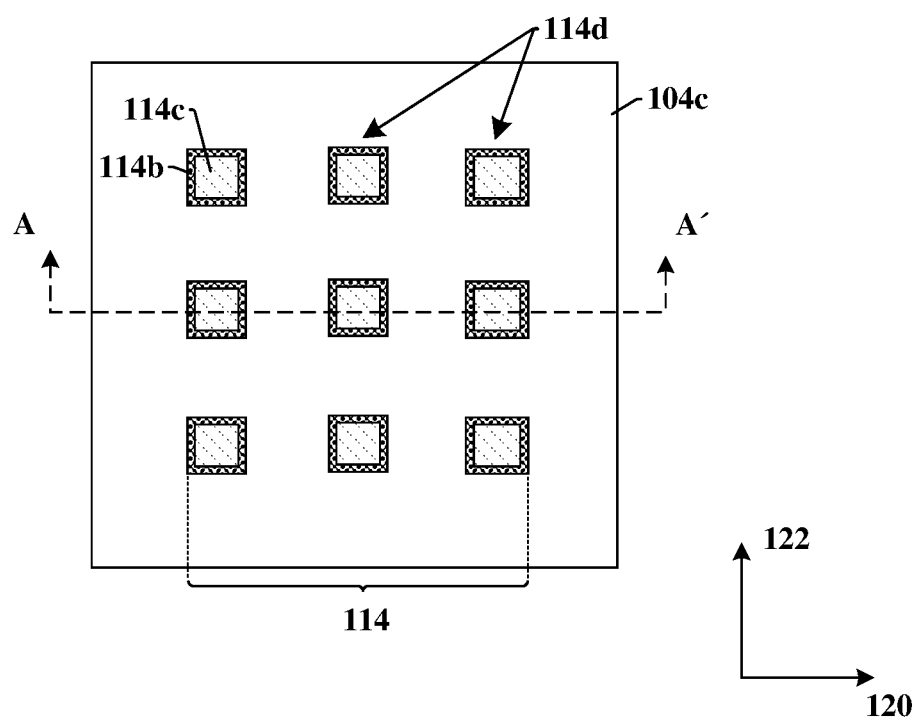

In some embodiments, shown in top-view 3102 of FIG. 31B, the lower segment 114 of the bond pad may comprise a plurality of discrete lower segments 114d. The plurality of discrete lower segments 114d may be formed in an array. The plurality of discrete lower segments 114d may be separated along a first direction 120 and along a second direction 122 that is perpendicular to the first direction 120. In some embodiments, cross-sectional view 3100 of FIG. 31A is taken along cross-sectional line A-A' of FIG. 31B.

Figure 31C:
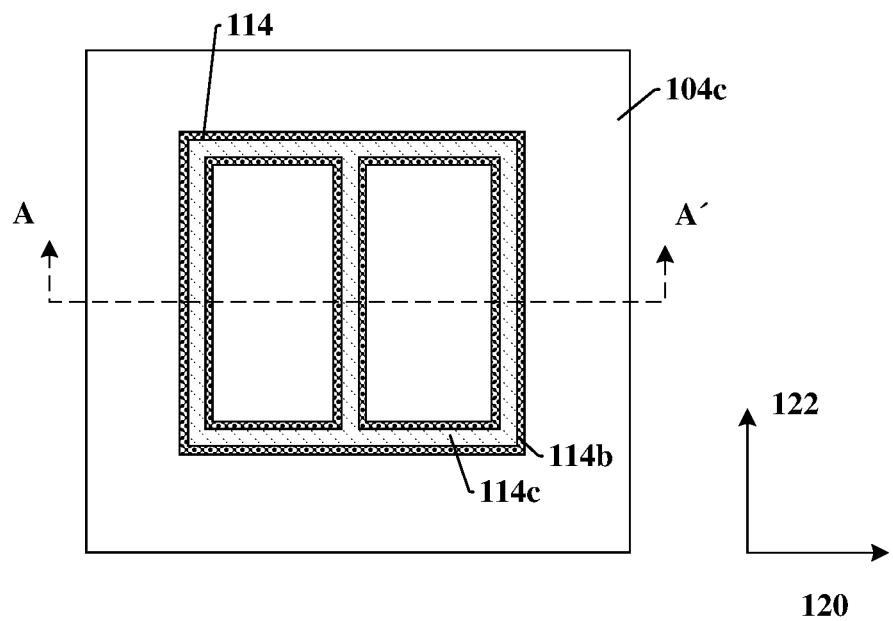

In some alternative embodiments, shown in top-view 3104 of FIG. 31C, the lower segment 114 of the bond pad may comprise a single continuous segment that continuously extends in a closed loop around one or more cavities 113. In some embodiments, the one or more cavities 113 respectively have a rectangular shape. In some embodiments, cross-sectional view 3100 of FIG. 31A is taken along cross-sectional line A-A' of FIG. 31C.

Figure 32:
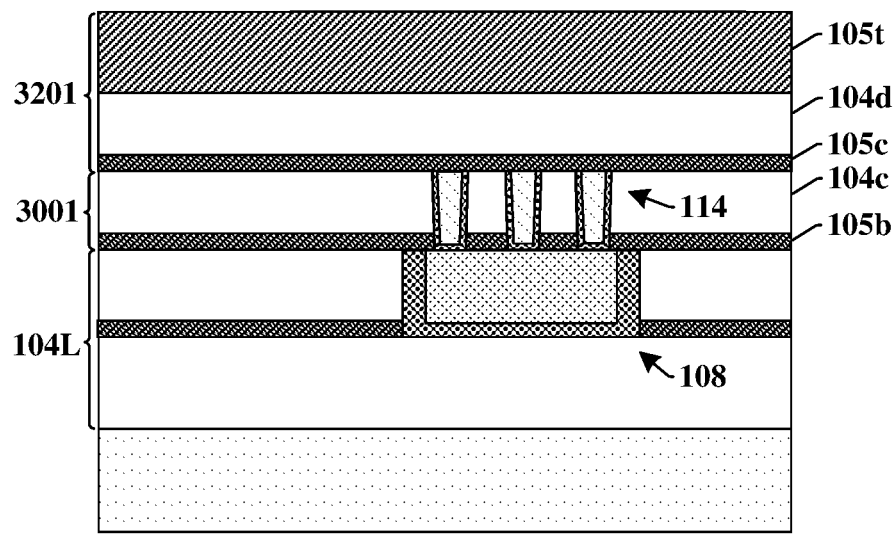

As shown in cross-sectional view 3200 of FIG. 32, a second upper dielectric structure 3201 is formed over the first upper dielectric structure 3001. In some embodiments, the second upper dielectric structure 3201 comprises a second bond pad etch stop layer 105c formed over the first bond pad ILD layer 104c, a second bond pad ILD layer 104d formed on the second bond pad etch stop layer 105c, and a top dielectric layer 105t formed over the second bond pad ILD layer 104d.

Figure 33:
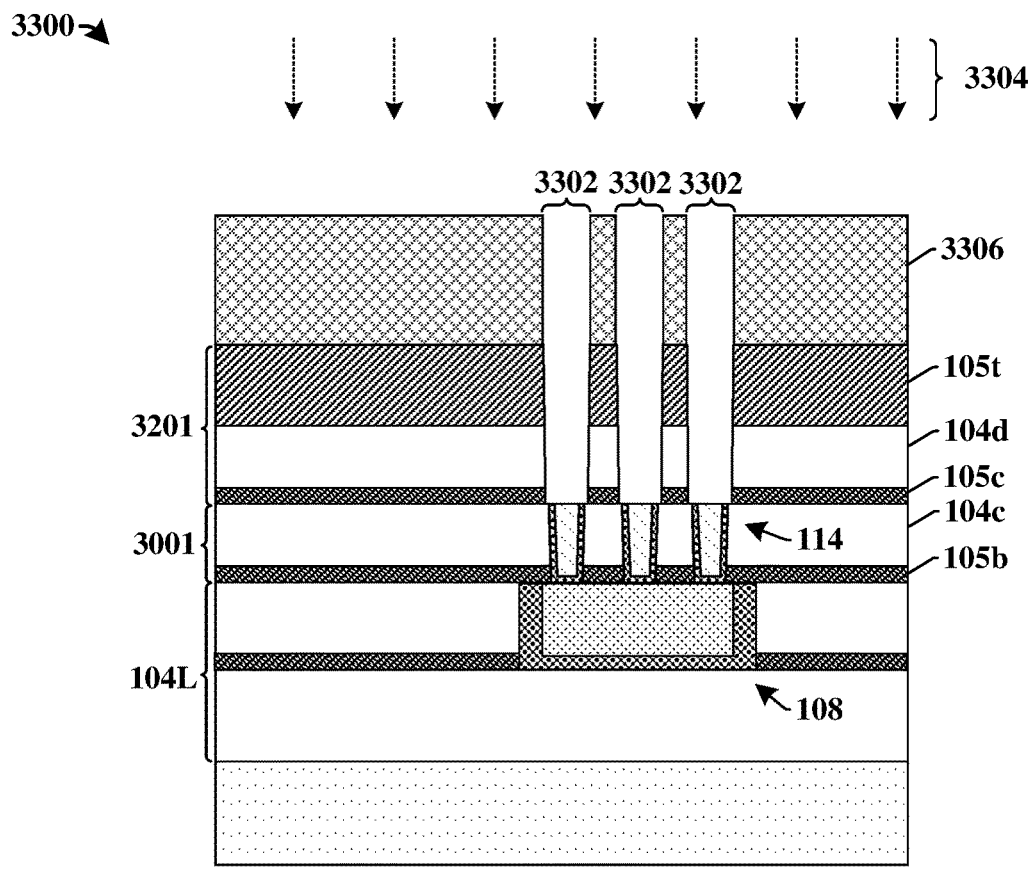

As shown in cross-sectional view 3300 of FIG. 33, one or more second bond pad openings 3302 are formed within the second upper dielectric structure 3201. In some embodiments, the one or more second bond pad openings 3302 may be formed according to a third patterning process. In some embodiments, the third patterning process may be performed by selectively exposing the second upper dielectric structure 3201 to a third etchant 3304 according to a third mask 3306. The third patterning process forms sidewalls of the second upper dielectric structure 3201 that define the one or more second bond pad openings 3302.

Figure 34A:
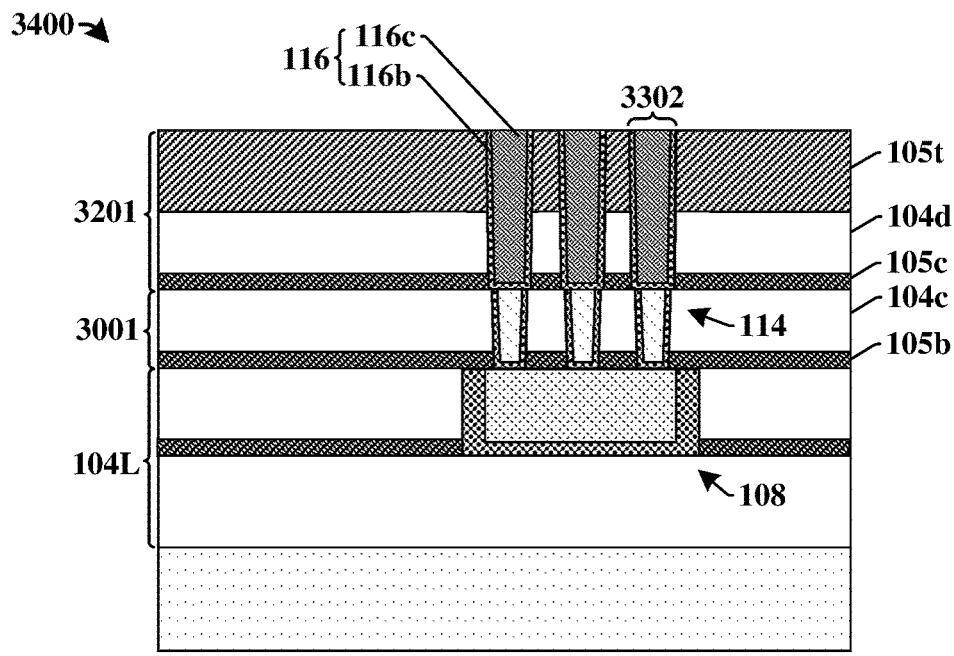

As shown in cross-sectional view 3400 of FIG. 34A, a second barrier layer 116b and a second conductive core 116c are formed within the one or more second bond pad openings 3302. In some embodiments, the second barrier layer 116b may be formed along interior surfaces of the second upper dielectric structure 3201 defining the one or more second bond pad openings 3302. The second conductive core 116c may be subsequently formed over the second barrier layer 116b and within the one or more second bond pad openings 3302. A planarization process may be performed to remove parts of the second barrier layer 116b and the second conductive core 116c to form an upper segment 116 of a bond pad.

Figure 34B:
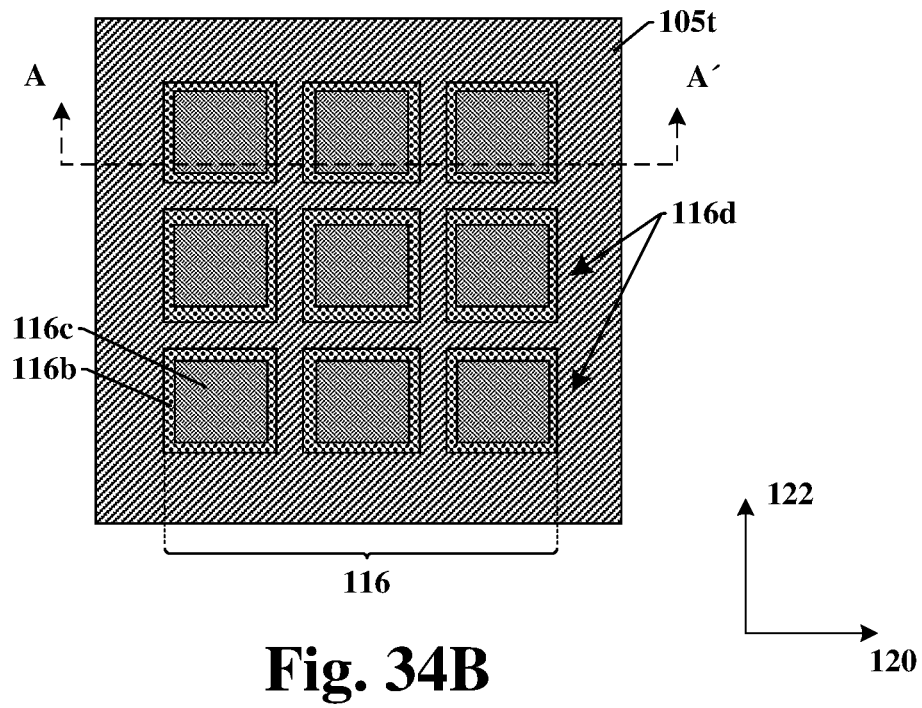

In some embodiments, shown in top-view 3402 of FIG. 34B, the upper segment 116 of the bond pad may comprise a plurality of discrete upper segments 116d. The plurality of discrete upper segments 116d may be formed in an array. The plurality of discrete upper segments 116d may be separated along the first direction 120 and along the second direction 122. In some embodiments, cross-sectional view 3400 of FIG. 34A is taken along cross-sectional line A-A' of FIG. 34B.

Figure 34C:
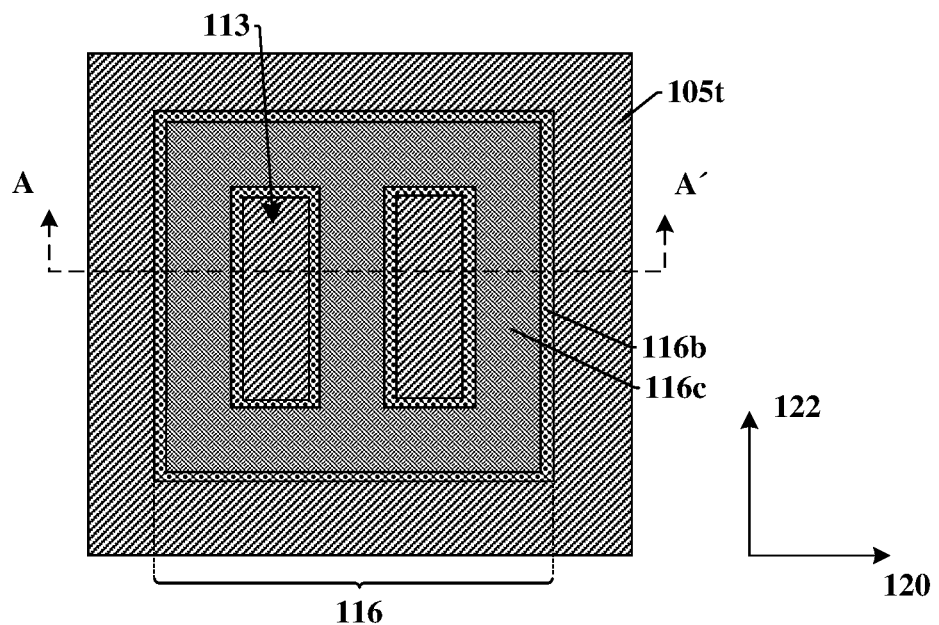
Figure 34D:
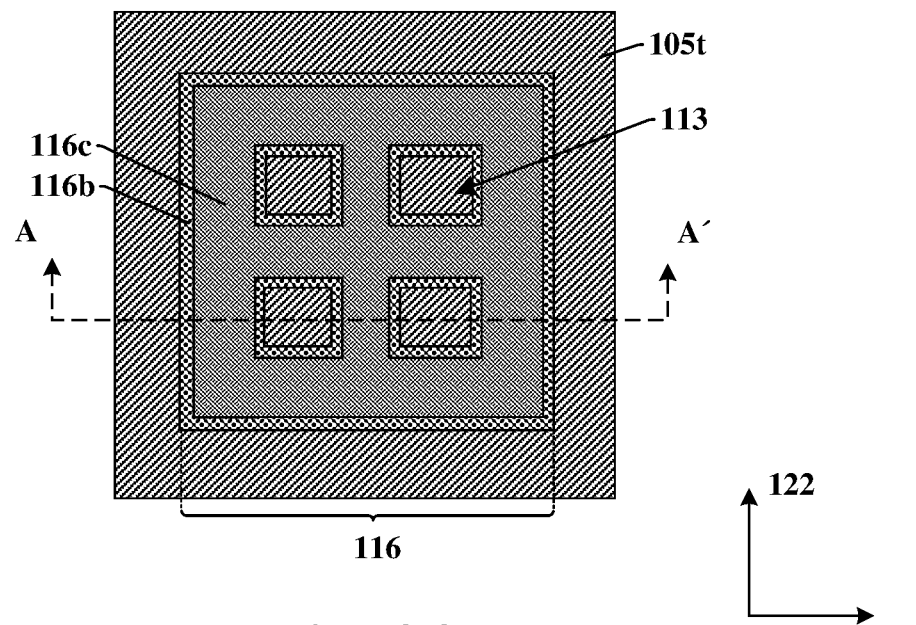

In some alternative embodiments, shown in top-view 3404 of FIG. 34C and top-view 3406 of FIG. 34D, the upper segment 116 of the bond pad may comprise a single continuous segment that continuously extends in a closed loop around one or more cavities 113. In some embodiments, the single continuous segment may directly overlie a plurality of discrete lower segments 114d (e.g., as shown in FIG. 31B), while in other embodiments the single continuous segment may directly overlie a single continuous lower segment (e.g., as shown in FIG. 31C). In some embodiments, cross-sectional view 3400 of FIG. 34A is taken along cross-sectional line A-A' of FIG. 34C or along cross-sectional line A-A' of FIG. 34D.

Figure 35:
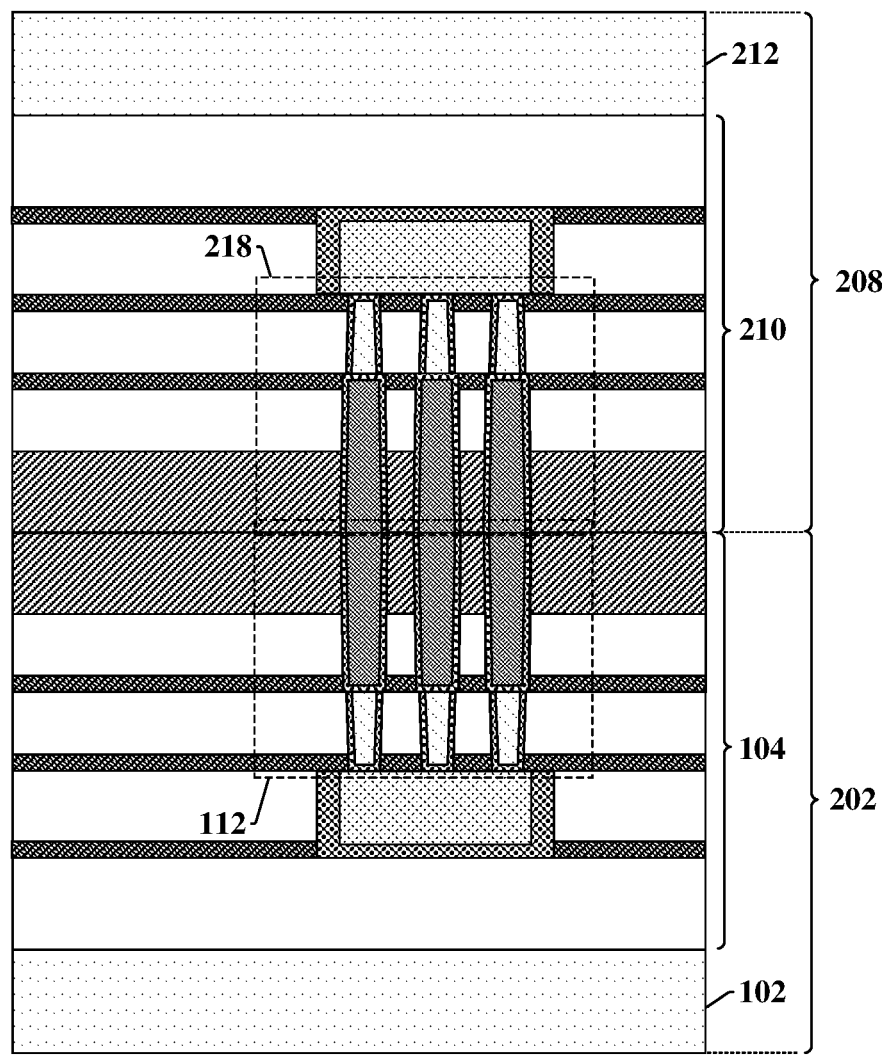

As shown in cross-sectional view 3500 of FIG. 35, the bond pad 112 of first IC die 202 is bonded to the additional bond pad 218 of a second IC die 208. During bonding, the plurality of discrete top surface segments of the bond pad 112 are brought into contact with a plurality of additional discrete segments of the additional bond pad 218. Furthermore, upper surfaces of the dielectric structure 104 are brought into contact with surfaces of an additional dielectric structure 210 of the second IC die 208, so as to form a hybrid bonding interface between the first IC die 202 and the second IC die 208.

Figure 36:
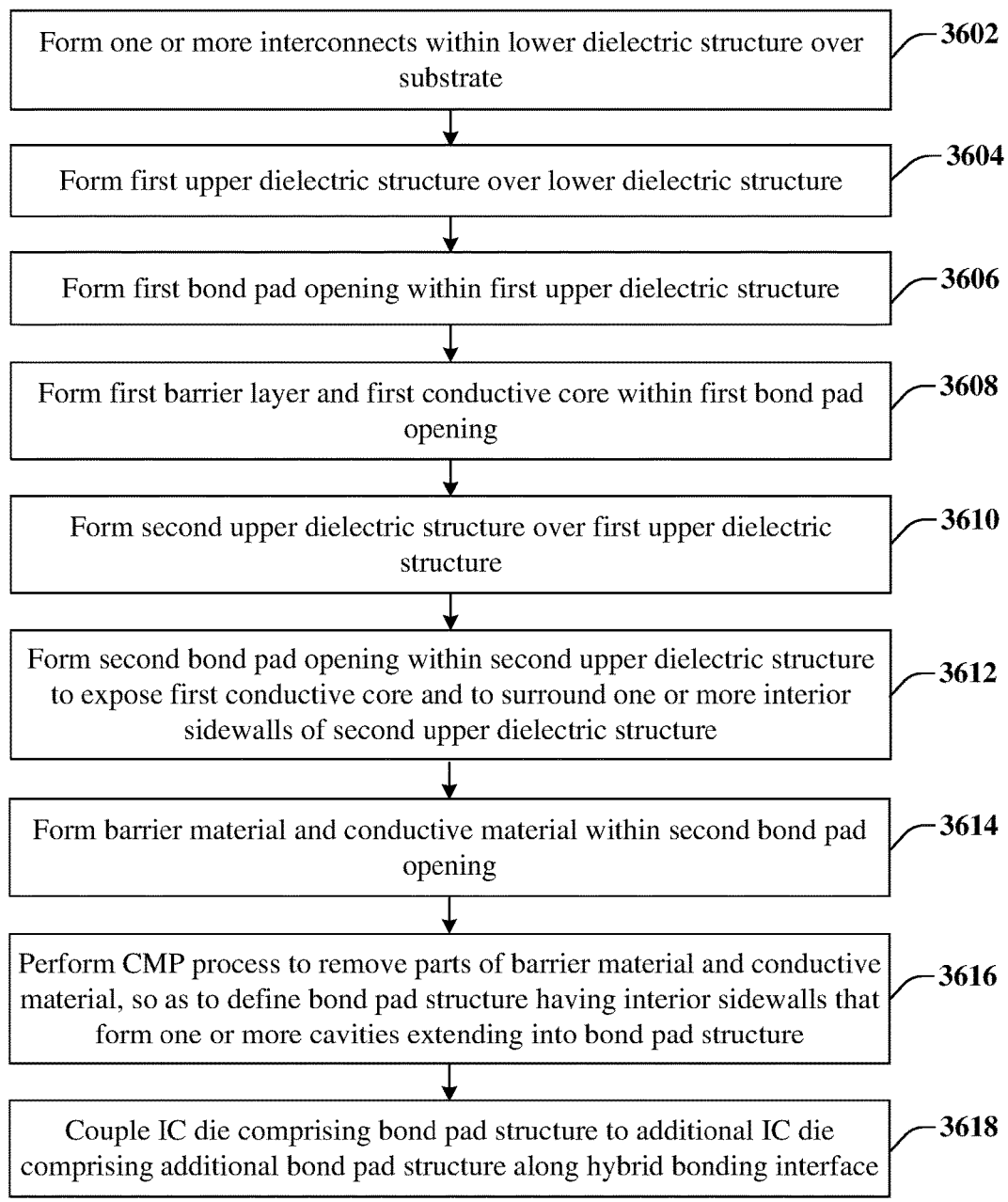
FIG. 36 illustrates a flow diagram of some embodiments of a method of forming an integrated chip structure comprising a disclosed bond pad having one or more cavities configured to reduce dishing of the bond pad.

FIG. 36 illustrates a flow diagram of some embodiments of a method 3600 of forming an integrated chip structure comprising a disclosed bond pad having one or more cavities configured to reduce dishing of the bond pad.

While method 3600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3602, one or more interconnects are formed within a lower dielectric structure over a substrate. FIG. 11 illustrates a cross-sectional view 1100 of some embodiments corresponding to act 3602. FIG. 19 illustrates a cross-sectional view 1900 of some additional embodiments corresponding to act 3602. FIG. 29 illustrates a cross-sectional view 2900 of some additional embodiments corresponding to act 3602.

At act 3604, a first upper dielectric structure is formed over the lower dielectric structure. FIG. 12 illustrates a cross-sectional view 1200 of some embodiments corresponding to act 3604. FIG. 20 illustrates a cross-sectional view 2000 of some additional embodiments corresponding to act 3604. FIG. 30 illustrates a cross-sectional view 3000 of some additional embodiments corresponding to act 3604.

At act 3606, a first bond pad opening is formed within the first upper dielectric structure. FIG. 12 illustrates a cross-sectional view 1200 of some embodiments corresponding to act 3606. FIGS. 20-23 illustrate cross-sectional views 2000-2300 of some additional embodiments corresponding to act 3606. FIG. 30 illustrates a cross-sectional view 3000 of some additional embodiments corresponding to act 3606.

At act 3608, a first barrier layer and a first conductive core are formed within the first bond pad opening. FIG. 13 illustrates a cross-sectional view 1300 of some embodiments corresponding to act 3608. FIG. 24 illustrates a cross-sectional view 2400 of some additional embodiments corresponding to act 3608. FIG. 31A illustrates a cross-sectional view 3100 of some additional embodiments corresponding to act 3608.

At act 3610, a second upper dielectric structure is formed over the first upper dielectric structure. FIG. 14 illustrates a cross-sectional view 1400 of some embodiments corresponding to act 3610. FIG. 25 illustrates a cross-sectional view 2500 of some additional embodiments corresponding to act 3610. FIG. 32 illustrates a cross-sectional view 3200 of some additional embodiments corresponding to act 3610.

At act 3612, a second bond pad opening is formed within the second upper dielectric structure to expose the first conductive core and to surround one or more interior sidewalls of the second upper dielectric structure. FIG. 15 illustrates a cross-sectional view 1500 of some embodiments corresponding to act 3612. FIG. 25 illustrates a cross-sectional view 2500 of some additional embodiments corresponding to act 3612. FIG. 33 illustrates a cross-sectional view 3300 of some additional embodiments corresponding to act 3612.

At act 3614, a barrier material and a conductive material are formed within the second bond pad opening. FIG. 16 illustrates a cross-sectional view 1600 of some embodiments corresponding to act 3614. FIG. 26 illustrates a cross-sectional view 2600 of some additional embodiments corresponding to act 3614. FIG. 34A illustrates a cross-sectional view 3400 of some additional embodiments corresponding to act 3614.

At act 3616, a chemical mechanical planarization (CMP) process is performed to remove parts of the barrier material and the conductive material so as to define a bond pad having interior sidewalls that form one or more cavities extending into the bond pad. The interior sidewalls are coupled to a top of the bond pad. FIGS. 17A-17B illustrate some embodiments corresponding to act 3616. FIGS. 27A-27B illustrate some additional embodiments corresponding to act 3616. FIG. 34A illustrates a cross-sectional view 3400 of some additional embodiments corresponding to act 3616.

At act 3618, an integrated chip die comprising the bond pad is brought into contact with an additional integrated chip die comprising an additional bond pad along a hybrid bonding interface. FIG. 18 illustrates a cross-sectional view 1800 of some embodiments corresponding to act 3618. FIG. 28 illustrates a cross-sectional view 2800 of some additional embodiments corresponding to act 3618. FIG. 35 illustrates a cross-sectional view 3500 of some additional embodiments corresponding to act 3618.

Accordingly, the present disclosure relates to an integrated chip structure having a bond pad with one or more cavities that are surrounded by the bond pad and that are filled with a dielectric material that is configured to mitigate dishing along an upper surface of the bond pad In some embodiments, the present disclosure relates to an integrated chip structure. The integrated chip structure includes one or more interconnects disposed within a dielectric structure over a substrate; a bond pad having a top surface arranged along a top surface of the dielectric structure, the top surface of the bond pad including a plurality of discrete top surface segments that are laterally separated from one another by one or more non-zero distances that extend between interior sidewalls of the bond pad, as viewed in a cross-sectional view; and the dielectric structure being disposed directly between the interior sidewalls of the bond pad. In some embodiments, a bottom surface of the bond pad laterally and continuously extends past one or more of the interior sidewalls of the bond pad. In some embodiments, the top surface of the bond pad is substantially co-planar with the top surface of the dielectric structure. In some embodiments, the one or more interconnects include a topmost interconnect disposed within the dielectric structure, the topmost interconnect having an upper surface that directly contacts a bottom surface of the bond pad and that continuously extends past outermost sidewalls of the bottom surface of the bond pad. In some embodiments, the one or more interconnects include a topmost interconnect disposed within the dielectric structure, the dielectric structure between the interior sidewalls of the bond pad continuously extending from the top surface of the dielectric structure to the topmost interconnect. In some embodiments, the bond pad includes a lower segment laterally extending between opposing sidewalls coupled to a bottom of the bond pad; and an upper segment having a lower surface disposed onto an upper surface of the lower segment, the upper segment laterally extending between opposing outermost sidewalls of the bond pad. In some embodiments, the lower surface of the upper segment physically contacts the upper surface of the lower segment. In some embodiments, the interior sidewalls of the bond pad are arranged within the upper segment and are coupled to horizontally extending surfaces that are directly above the lower surface of the upper segment. In some embodiments, the bond pad continuously wraps extends in an unbroken loop, as viewed in a top-view of the bond pad.

In other embodiments, the present disclosure relates to an integrated chip structure. The integrated chip structure includes one or more interconnects surrounded by a dielectric structure disposed on a substrate; a bond pad surrounded by the dielectric structure and having a lower segment extending between outer edges of lower sidewalls arranged along a bottom of the bond pad, and an upper segment extending between outer edges of upper sidewalls arranged along a top of the bond pad; and the upper segment of the bond pad including one or more interior sidewalls separated by non-zero distances between edges of a top surface of the bond pad, the dielectric structure being between the edges of the top surface of the bond pad. In some embodiments, the upper segment has a lower surface that continuously extends past opposing outer edges of the lower segment. In some embodiments, the further integrated chip structure includes one or more additional interconnects surrounded by an additional dielectric structure disposed on a second substrate; an additional bond pad surrounded by the additional dielectric structure and having one or more additional interior sidewalls separated by the additional dielectric structure; and the bond pad contacting the additional bond pad along a conductive interface and the dielectric structure between edges of the top surface of the bond pad contacting the additional dielectric structure separating the one or more additional sidewalls along a dielectric interface. In some embodiments, the upper sidewalls vertically extend below a top of the lower sidewalls. In some embodiments, the upper segment includes a barrier layer and a conductive core, the dielectric structure contacting sidewalls of the barrier layer. In some embodiments, the top surface of the bond pad incudes a plurality of discrete top surface segments as viewed in a cross-sectional view of the bond pad, the plurality of discrete top surface segments being separated from one another by the non-zero distances. In some embodiments, the interior sidewalls of the bond pad are further coupled to a horizontally extending surface of the bond pad that faces away from the substrate. In some embodiments, the bond pad includes an outer ring segment that continuously extends in an unbroken loop.

In yet other embodiments, the present disclosure relates to a method of forming an integrated chip structure. The method includes forming a first bond pad opening within a first upper dielectric structure formed over a lower dielectric structure surrounding one or more interconnects over a substrate; forming a first barrier layer and a first conductive core within the first bond pad opening; forming a second upper dielectric structure over the first upper dielectric structure; forming a second bond pad opening within the second upper dielectric structure to expose the first conductive core and to surround one or more interior sidewalls of the second upper dielectric structure; forming a barrier material and a conductive material within the second bond pad opening; and removing parts of the barrier material and the conductive material, removing the parts of the barrier material and the conductive material forming a bond pad having interior sidewalls that form one or more cavities extending into the bond pad. In some embodiments, the one or more cavities are filled with the second upper dielectric structure. In some embodiments, the bond pad has a plurality of discrete upper surfaces that are separated from one another by the second upper dielectric structure, as viewed along a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
    forming a first bond pad opening within a first upper dielectric structure formed over a lower dielectric structure surrounding one or more interconnects over a substrate;
    forming a first barrier layer and a first conductive core within the first bond pad opening;
    forming a second upper dielectric structure over the first upper dielectric structure;
    forming a second bond pad opening within the second upper dielectric structure to expose the first conductive core and to surround one or more interior sidewalls of the second upper dielectric structure;
    forming a barrier material and a conductive material within the second bond pad opening; and
    removing parts of the barrier material and the conductive material, wherein removing the parts of the barrier material and the conductive material forms a bond pad having interior sidewalls that form one or more cavities extending into the bond pad.

2. The method of claim 1, wherein the one or more cavities are filled with the second upper dielectric structure.

3. The method of claim 1, wherein the bond pad has a plurality of discrete upper surfaces that are separated from one another by the second upper dielectric structure, as viewed along a cross-sectional view.

4. A method of forming an integrated chip structure, comprising:
    forming one or more first bond pad openings within a first upper dielectric structure over a substrate;
    forming one or more lower conductive bond pad segments within the one or more first bond pad openings;
    forming a second upper dielectric structure over the first upper dielectric structure;
    forming one or more second bond pad openings within the second upper dielectric structure, wherein the one or more second bond pad openings expose the one or more lower conductive bond pad segments and surround an interior segment of the second upper dielectric structure;
    forming a conductive material within the one or more second bond pad openings and on the one or more lower conductive bond pad segments;
    performing a planarization process on the conductive material and on the interior segment of the second upper dielectric structure to form one or more upper conductive bond pad segments within the one or more second bond pad openings; and
    bonding the one or more upper conductive bond pad segments to a bonding structure disposed on a second substrate.

5. The method of claim 4, wherein the one or more lower conductive bond pad segments are completely laterally confined between opposing outermost sides of the one or more upper conductive bond pad segments.

6. The method of claim 4, wherein the one or more lower conductive bond pad segments comprise a plurality of discrete lower conductive bond pad segments laterally separated from one another along a first direction and along a second direction perpendicular to the first direction.

7. The method of claim 6, wherein the one or more upper conductive bond pad segments continuously extend above the plurality of discrete lower conductive bond pad segments.

8. The method of claim 6, wherein the one or more upper conductive bond pad segments comprise a plurality of discrete upper conductive bond pad segments disposed over respective ones of the plurality of discrete lower conductive bond pad segments.

9. The method of claim 4, wherein the one or more lower conductive bond pad segments extend laterally past one or more sidewalls of the one or more upper conductive bond pad segments.

10. The method of claim 4, wherein the one or more lower conductive bond pad segments comprise an upper surface that extends laterally past one or more sidewalls of the one or more upper conductive bond pad segments.

11. A method of forming an integrated chip structure, comprising:
   forming a plurality of conductive interconnects within an inter-level dielectric (ILD) structure formed over a substrate;
   forming an upper dielectric structure over the ILD structure;
   forming a conductive bond pad within the upper dielectric structure, wherein the conductive bond pad comprises upper surfaces that laterally surround one or more segments of the upper dielectric structure in a cross-sectional view, the one or more segments of the upper dielectric structure vertically extending to a height of the upper surfaces of the conductive bond pad; and
   bonding the conductive bond pad to an additional conductive bond pad on a second substrate, wherein the upper surfaces of the conductive bond pad contact the additional conductive bond pad in the cross-sectional view.

12. The method of claim 11, wherein the conductive bond pad continuously extends from along a sidewall of the one or more segments of the upper dielectric structure to below the one or more segments of the upper dielectric structure.

13. The method of claim 11, wherein the one or more segments of the upper dielectric structure comprise a first segment, the first segment having a topmost surface that extends between opposing outermost sidewalls of the first segment.

14. The method of claim 11, wherein forming the conductive bond pad, comprises:
   forming a lower region having one or more lower bond pad segments; and
   forming an upper region onto a top surface of the lower region, the upper region having one or more upper bond pad segments.

15. The method of claim 14,
   wherein the one or more segments of the upper dielectric structure are laterally surrounded by the conductive bond pad along a first direction; and
   wherein the one or more segments of the upper dielectric structure extend past opposing outer sidewalls of the one or more lower bond pad segments along a second direction perpendicular to the first direction.

16. The method of claim 14, wherein the one or more upper bond pad segments have a lower surface that continuously extends past a sidewall of the one or more lower bond pad segments.

17. The method of claim 14, wherein interior sidewalls of the conductive bond pad are arranged within the upper region and are coupled to horizontally extending surfaces that are directly above a bottommost surface of the upper region.

18. The method of claim 11, wherein a bottom surface of the conductive bond pad laterally and continuously extends past one or more of the interior sidewalls of the conductive bond pad.

19. The method of claim 11, wherein the upper surfaces of the conductive bond pad are substantially co-planar with a top surface of the one or more segments of the upper dielectric structure.

20. The method of claim 11, wherein the conductive bond pad continuously extends in an unbroken loop, as viewed in a top-view of the conductive bond pad.

* * * * *